United States Patent [19]
Fredrickson et al.

[11] Patent Number: 5,778,009
[45] Date of Patent: Jul. 7, 1998

[54] DEDICATED ALU ARCHITECTURE FOR 10-BIT REED-SOLOMON ERROR CORRECTION MODULE

[75] Inventors: Lisa Fredrickson, Ojai; Michael Ou, Mountain View, both of Calif.

[73] Assignee: Quantum Corporation, Milpitas, Calif.

[21] Appl. No.: 490,345

[22] Filed: Jun. 14, 1995

[51] Int. Cl.[6] .................................................. H03M 13/00
[52] U.S. Cl. ........................ 371/37.1; 371/37.5; 371/40.1
[58] Field of Search ................................. 371/37.1, 37.2, 371/37.5, 38.1, 39.1, 40.1; 360/40

[56] References Cited

U.S. PATENT DOCUMENTS

| | | | |
|---|---|---|---|
| 4,117,458 | 9/1978 | Burghard et al. | 371/37.2 |
| 4,142,174 | 2/1979 | Chen et al. | 371/37.1 |
| 4,162,480 | 7/1979 | Berlekamp | 371/37.1 |
| 4,364,081 | 12/1982 | Hashimoto et al. | 358/13 |
| 4,410,989 | 10/1983 | Berlekamp | 371/39.1 |
| 4,413,339 | 11/1983 | Riggle et al. | 371/40.1 |
| 4,730,321 | 3/1988 | Machado | 371/37.5 |
| 4,821,268 | 4/1989 | Berlekamp | 371/37.1 |
| 4,835,775 | 5/1989 | Seroussi | 371/37.1 |
| 4,843,607 | 6/1989 | Tong | 371/37.1 |
| 4,856,003 | 8/1989 | Weng | 371/37.1 |
| 4,916,702 | 4/1990 | Berlekamp | 371/39.1 |
| 4,958,348 | 9/1990 | Berlekamp et al. | 371/37.1 |
| 5,241,546 | 8/1993 | Peterson et al. | 371/37.1 |
| 5,271,021 | 12/1993 | Berlekamp et al. | 371/37.1 |
| 5,333,143 | 7/1994 | Blaum et al | 371/40.4 |

OTHER PUBLICATIONS

Berlekamp, Elwyn R., "The Technology of Error–Correcting Codes," *Proceedings of the IEEE*, vol. 68, No. 5, May 1980, pp. 564–593.

Fettweis, Gerhard, and Hassner, Martin, "A Combined Reed–Solomon Encoder and Syndrome Generator with Small Hardware Complexity," *IEEE*, (0–7803–0593–0) 1992, pp. 1871–1874.

Seroussi, Gadiel, "A Systolic Reed–Solomon Encoder," *IEEE Transactions on Information Theory*, vol. 37, No. 4, Jul. 1991, pp. 1217–1220.

Seroussi, Gadiel and Roth, Ron M., "On MDS Extensions of Generalized Reed–Solomon Codes," *IEEE Transactions on Information Theory*, vol. IT–32, No. 3, May 1986.

Roth, Ron M. and Seroussi, Gadiel, "On Generator Matrices of MDS Codes," *IEEE Transactions on Information Theory*, vol. IT–32, No. 6, Nov. 1985.

Roth, Ron M. and Seroussi, Gadiel, On Cyclic MDS Codes of Length q Over GF (q) *IEEE Transactions on Information Theory*, vol. IT–32, No. 2, Mar. 1986.

*Primary Examiner*—Reba I. Elmore
*Assistant Examiner*—Emmanuel L. Moise
*Attorney, Agent, or Firm*—David B. Harrison

[57] ABSTRACT

A system architecture for implementing a 10-bit Reed-Solomon code for detecting and correcting data errors in a single code word to protect a data block containing up to 1023 10-bit data symbols, i.e., the equivalent of up to 1278 8-bit symbols, including error check redundancy, maximizes the use of all allocated error correction overhead for an entire block of data, regardless of the particular error pattern characteristics encountered in a given system application. The architecture is particularly well suited for digital data processing and/or storage systems encountering non-bursty, (i.e., substantially random), error patterns, such is characteristic of data storage and retrieval systems employing semiconductor based memory stores. 5-bit extension field operations, (i.e., over a Galois field $GF(2^5)$), generated by using the irreducible polynomial, $P_{32}(X)=X^5+X^2+1$, over GF(2), are utilized to perform certain, requisite arithmetic functions over the Galois field $GF(2^{10})$ with a hardware-minimized error correction architecture.

18 Claims, 4 Drawing Sheets

DEDICATED ALU ARCHITECTURE FOR 10-BIT REED-SOLOMON ERROR CORRECTION MODULE

FIELD OF THE INVENTION

This invention pertains to the field of error correction in digital data processing and storage systems and, more particularly, to methods and apparatus for employing a 10-bit Reed-Solomon code for the detection and correction of digital data errors within a block of data being transmitted between elements of a data processing and/or storage system.

BACKGROUND OF THE INVENTION

Error correction techniques and architectures are well known in digital data processing and communications systems, including systems having data storage subsystems such as magnetic, optical, or semiconductor based memory stores. Detection and, where possible, correction of erroneous data has been achieved by using an encoder circuit to construct some number of "redundant" m-bit error check symbols, which mathematically characterize the information in a selected block of data. The error check symbols are then appended to the data block and transferred or stored therewith. When the data block is received, or later retrieved from memory, the accuracy of the data can be evaluated by use of these appended error check symbols. For example, one methodology is to repeat the encoding process on the received or retrieved block of data, often using the same encoder, and then compare the newly derived error check symbols with those previously appended to the data block. If the newly derived error check symbols are identical to those appended to the data block, the information contained in the received data block is presumed to be error free; if not, "error syndrome" information is generated from the difference between the newly derived and originally appended error check symbols, which, depending upon the nature and amount of the error check information, can be used to locate the error(s) within the data block and determine the correct data values for substitution therefor.

The use of Reed-Solomon codes has become a prevalent methodology for performing error detection and correction in digital communications, processing and storage applications. In a Reed-Solomon code, sequential m-bit data symbols forming a data block are treated as being representative of coefficients of a polynomial in a variable, e.g., "x". In particular, a sequence of k m-bit data "message" symbols $\{m_0, m_1, m_2, \ldots, m_{k-1}\}$ are treated as a "message polynomial," $m(x)$, of degree k-1, where $$m(x)=m_0 x^{k-1}+m_1 x^{k-2}+\ldots+m_{k-2}x+m_{k-1},$$

An encoder divides the message polynomial, $m(x)$, by a selected "generator polynomial," $g(x)$, to produce a "remainder polynomial," $r(x)$, having coefficients in the form of r m-bit error check symbols.

A Reed-Solomon generator polynomial, $g(x)$, has the general form:

$$g(x) = \prod_{i=0}^{r-1} (x - \alpha^{J_0+i})$$

where $\alpha$ ("alpha") is a primitive element of a Galois field, GF(q), whose q-1 powers, $\{\alpha^0, \alpha^1, \alpha^2, \ldots, \alpha^{q-2}\}$, exhaust the non-zero elements of the field and where $J_0$ is some arbitrary logarithm base a of the first root of the generator polynomial. Usually, in binary systems, q is a power of 2, i.e., $q=2^m$, for some m. For example, where r=4,—i.e., where four redundant error check symbols are to be generated—, the generator polynomial may be expressed in the factored form:

$$g(x)=(x-\alpha^{J_0})(x-\alpha^{J_0+1})(x-\alpha^{J_0+2})(x-\alpha^{J_0+3}).$$

As can be seen, the nature of the generator polynomial, $g(x)$, determines, among other things, the extent and complexity of the error correction code. In particular, the degree of the generator polynomial determines the number (r) of error check symbols contained in the remainder polynomial, $r(x)$. However, the greater the degree of the polynomial that is selected for the generator polynomial, the more complex the associated encoder circuitry must be to perform the necessary computations.

Generally, the error check symbols are appended to the message symbols to form a Reed-Solomon "code word" of length n=k+r m-bit symbols, where the message and error check symbols are elements in the finite Galois field $GF(2^m)$. This is referred to as an "n-symbol codeword," consisting of "m-bit symbols," or as an example of an "m-bit Reed-Solomon implementation." By definition, each code word, when considered as a polynomial, $c(x)$, of degree n-1, where $$c(x)=c_0 x^{n-1}+c_1 x^{n-2}+\ldots+c_{n-2}x+c_{n-1},$$

is evenly divisible by the generator polynomial, $g(x)$. In other words, $c(x) \bmod g(x)=0$. Since a correctly received code word, $c'(x)$, will also be evenly divisible by $g(x)$, one well known procedure for detecting errors upon receipt or retrieval of a code word, $c'(x)$, is to divide it by $g(x)$. If $c'(x)$ mod $g(x)$ is zero, then $c'(x)$ is presumed to have been correctly received. If the remainder of $c'(x)/g(x)$ is non-zero, then one or more errors have occurred and an error correction routine is invoked by calculating r m-bit "error syndromes," $S_o \ldots S_{r-1}$, respectively, (i.e., "symptoms of error"), from the non-zero remainder of $c'(x)/g(x)$.

Several procedures are known for computing the error locations and proper values from the calculated error syndromes. These techniques involve error-locator-polynomial determination, root finding for determining the positions of the errors, and error value determination for determining the correct bit-pattern of the errors. In many error detection and correction architectures, the block of data being evaluated is temporarily stored in a buffer memory, while the error correction procedure is performed with the error syndromes generated from the received, or retrieved, code word. Known architectures may perform the error correction routines by using hardware circuitry under the control of a programmed state machine or arithmetic logic unit, by using a microprocessor under firmware control, or by some combination of both. For example, several known architectures perform the correction of a very small number of errors, typically no more than one or two, by hardware circuitry "on-the-fly," i.e., without stopping or substantially slowing the bit-rate of the data blocks during a typical transfer, or retrieval, of multiple blocks of data. The correction of more than these one or two errors, if enabled by sufficient error syndrome information, is typically given to a system level microprocessor to carry out the error correction operations on an as-needed, or "interrupt" basis, i.e., where the data flow is temporarily slowed, or stopped. When this happens, the microprocessor is fed the error correction syndrome information for a data block having the more than one or two errors and calculates values for locating and correcting all of the errors under direction of error correction firmware. In the event the data is not correctable, i.e., where there are more errors detected in the block than can be corrected by the hardware and/or firmware error correction architecture, an error recovery procedure may be attempted, e.g., which may involve one or more retries to recover data from the storage media.

One general limitation of Reed-Solomon codes is that the maximum number of m-bit data symbols that can be corrected within an m-bit code word is limited to the integer portion, or "floor," of the number of appended error check symbols (r) divided by two, i.e., INT(r/2). Another general limitation is that each m-bit code word is limited to a maximum length of $2^m-1$ symbols, sometimes referred to as its "natural block length," including both the source data symbols and the appended error check symbols. Thus, implementations of Reed-Solomon error correction techniques must take into account these limitations.

For example, commonly owned U.S. Pat. No. 5,241,546, issued to Peterson et al., discloses a system architecture which employs a Reed-Solomon code to detect and correct data errors in a disk drive data storage system which handles data in blocks, or "sectors," containing 512 8-bit symbols (or "bytes"), d[1], d[2], . . . , d[512], respectively. Because the total number of 8-bit symbols that can be protected in a single 8-bit code word is $2^8-1=255$ symbols, each 512 byte data sector is divided into smaller blocks for purposes of performing error correction. In so doing, the Peterson et al. Patent also takes into account that data errors encountered in certain digital data communication and storage systems, such as in magnetic based disk drive systems, are often "bursty" in nature, i.e., the data errors tend to appear across consecutive bit positions within a block of data, as opposed to occurring randomly. The 512 data bytes are therefore serially divided into three separate "interleaves," each interleave containing every third data byte,—i.e., with interleave 1 containing data bytes d[1], d[4], d[7], . . . , d[511], interleave 2 containing data bytes d[2], d[5], d[8], . . . , d[512], and interleave 3 containing data bytes d[3], d[6], d[9], . . . , d[510], respectively. Each interleave is then separately encoded to form a corresponding 8-bit Reed-Solomon code word.

By distributing successive data bytes into separate code words for purposes of error correction, the 3-interleave architecture offers the advantage of, for example, treating the occurrence of an "error burst" of three successive corrupted data bytes as, in effect, a single byte error occurring in each code word. In other words, because of the substantial likelihood that data errors, if any, will occur in consecutive data symbols, the 3-interleave architecture increases the probability that encountered symbol errors will be distributed evenly into separate code words, thereby facilitating correction of a greater number of total symbol errors per data sector, without requiring additional error correction capability for a given code word.

The advantage of an interleave architecture is lost, however, if the communication, data processing, and/or storage system application is not prone to bursty error patterns. For example, in a digital data system employing a semiconductor based memory in which error patterns occur in a substantially random manner, implementation of an interleave architecture may actually result in a substantial portion of the allocated error check redundancy being ineffective, since encountered errors are much less likely to be evenly distributed across the interleaves. Moreover, if the number of errors occurring in a single interleave exceed the error correction capability of that code word, the entire data sector may be lost, even if the total number of errors occurring sector-wide would otherwise have been within the allotted error correction capability had they been distributed evenly across all interleaves.

Thus, in non-bursty applications it would be desirable to fully utilize all allocated error check redundancy to perform error correction for an entire data block or sector, e.g., by using a single Reed-Solomon code word, regardless of the particular symbol size format of the data block.

SUMMARY OF THE INVENTION

The present invention provides a Reed-Solomon error correction methodology and architecture which is suited for digital data communication, processing and/or storage systems encountering substantially random error patterns, such as is characteristic of a data storage and retrieval system employing a semiconductor based memory store.

A general object of one aspect of the present invention is to provide a Reed-solomon error correction methodology and architecture ideally adapted to a mass production environment, which minimizes hardware components and the related production costs associated therewith.

A general object of another aspect of the present invention is to provide system architecture for implementing a 10-bit Reed-Solomon code for detecting and correcting data errors in a single code word to protect a data block containing up to 1023 10-bit data symbols, i.e., the equivalent of up to 1278 8-bit symbols, including error check redundancy.

A general object of yet another aspect of the present invention is to provide a Reed-Solomon error correction architecture which maximizes the use of all allocated error correction overhead for an entire block of data, regardless of the particular error pattern characteristics encountered in a given system application.

A general object of yet another aspect of the present invention is to provide a practical implementation of a 10-bit Reed-Solomon error correction code by employing 5-bit extension field operations over a Galois field ($2^5$) to perform certain requisite arithmetic functions with a hardware-minimized error correction architecture.

A more specific object of the hardware-minimized implementation aspect of the present invention is to provide a 10-bit Reed-Solomon error correction methodology and architecture which employs 5-bit extension field operations utilizing a Galois field GF($2^5$) generated from the generator polynomial $g(x)=x^5+x^2+1$, over GF(2).

Yet another more specific object of the hardware-minimized implementation aspect of the present invention is to provide a 10-bit Reed-Solomon error correction methodology and architecture which generates the Galois field GF($2^{10}$) using the irreducible polynomial $P_{1024}(y)=y^2+y+1$, over a Galois field GF($2^5$) generated from the generator polynomial $g(x)=x^5+X^2+1$, over GF(2).

In accordance with these and other objects, features and aspects of the present invention, a data block of m-bit data symbols is formatted into a sequence of k 10-bit data symbols and passed through an encoder which constructs a preselected number r of 10-bit error check symbols, where k+r≦1023. The error check symbols are converted back into an m-bit symbol format and appended to the original m-bit data block for transport or storage. Upon being received, or later retrieved from storage, the m-bit data block, including the appended error check symbols, is again formatted as a sequence of 10-bit symbols and passed through a decoder/ syndrome generator, which generates r 10-bit error syndromes. If any of the error syndromes are non-zero, thereby indicating the existence of one or more 10-bit symbol errors, the error syndromes are fed into an error correction module, which, using a Galois field arithmetic logic unit ("GF-ALU") under the control of a programmed state machine, conducts 10-bit Reed-Solomon error correction operations (i.e., over a 10-bit Galois field $GF(2^{10})$), preferably to determine the location and correct values of up to two 10-bit symbol errors by hardware solution and up to four 10-bit symbol errors under firmware control.

According to one aspect of the present invention, the GF-ALU performs certain arithmetic functions, preferably including at least the 10-bit multiplication and inversion functions, respectively, by 5-bit extension field operations over a Galois "sub field" $GF(2^5)$, generated by using the irreducible polynomial:

$$P_{32}(x)=x^5+x^2+1, \text{ over } GF(2),$$

with each 5-bit nibble represented in a standard basis as a fourth degree polynomial of "x"; i.e., where a 5-bit nibble $\{d_4,d_3,d_2,d_1,d_0\}$ is represented as coefficients in the polynomial:

$$d_4x^4+d_3x^3+d_2x^2+d_1x+d_0.$$

Addition of the 5-bit nibbles is preferably performed through a bit-wise XOR operation. Multiplication is preferably performed as standard polynomial multiplication, reduced by modulo $P_{32}(x)$.

According to another aspect of the present invention, the field $GF(2^{10})$ is generated using the irreducible polynomial:

$$P_{1024}(y)=y^2+y+1, \text{ over } GF(2^5),$$

with the 10 bit symbols represented in a standard basis as a sum of the powers of "y" over $GF(2^5)$, i.e., with each 10-bit symbol treated as two 5-bit nibbles $(e_1, e_0)$, which represents $e_1y+e_0$, to perform the requisite arithmetic functions. Addition of the 10-bit symbols is preferably performed through a bit-wise XOR operation. Multiplication is preferably performed as standard polynomial multiplication, reduced by modulo $P_{1024}(y)$. In one preferred embodiment, the element $\alpha=(101)h$ (i.e., $\{0100000001\}$ binary), serves as a primitive element of $GF(2^{10})$.

In this manner, 10-bit arithmetic operations are accomplished by concatenating the result of 5-bit extension field operations performed on the most significant and least significant 5-bit nibbles, respectively, of the respective 10-bit symbols.

These and other objects, aspects, advantages and features of the present invention will be more fully understood and appreciated by those skilled in the art upon consideration of the following detailed description of a preferred embodiment, presented in conjunction with the accompanying drawings.

BRIEF DESCRIPTION OF THE DRAWINGS

It is to be understood that the accompanying drawings are provided for the purpose of illustration only, and are not intended as a definition of the limits of the invention. The drawings illustrate both the design and utility of a preferred embodiment of the present invention, in which.

DETAILED DESCRIPTION OF THE PREFERRED EMBODIMENT

Figure 1:
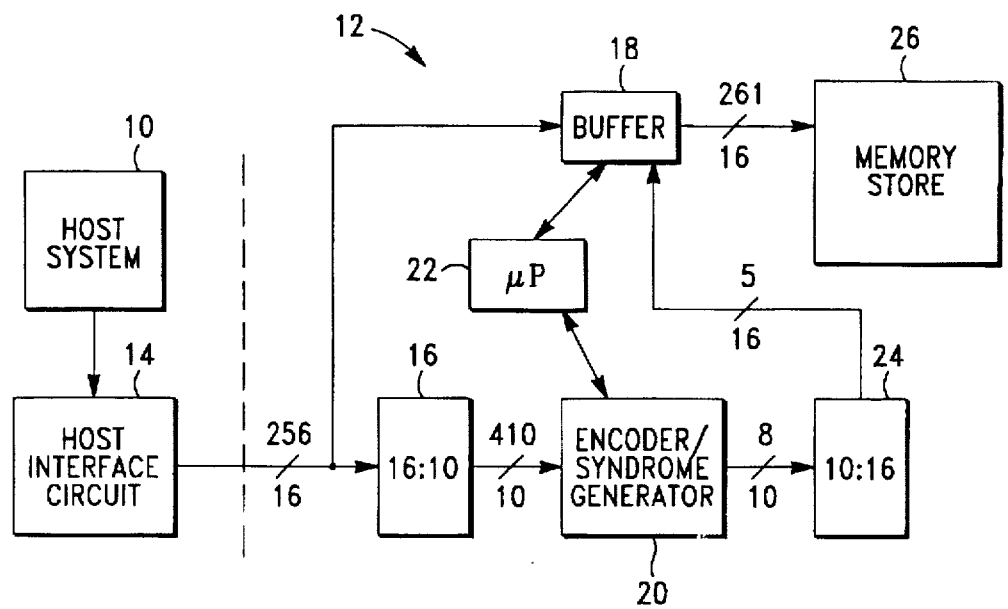
FIG. 1 is a functional block diagram of the host-to-memory (write) circuit of a semiconductor based data storage and retrieval system embodying aspects of the present invention.

Referring to FIG. 1, a host data processing system 10 packetizes a block of digital data for storage in an adjunct data storage and retrieval system 12. While particular blocks of data being transported by the host system 10 to the storage system 12 may vary in size and format with differing applications and operating system architectures, for purposes of describing the illustrated preferred embodiment, a commonly used data block size is selected, which contains 256 16-bit data symbols for a total of 4096 bits. A host interface circuit 14, such as, e.g., a SCSI or IDE interface device, receives the data block from the host system 10. The interface circuit 14 then transmits the data block through a 16:10 bit wide conversion circuit 16, which serially reformats the 256 16-bit data symbols into 410 10-bit data symbols, i.e., a total of 4100 bits, with the final four bits of the 410th data symbol comprising added zeros. The data block is also transmitted by the host interface circuit 14 directly into a holding buffer 18, without reformatting.

In alternate embodiments, the data block 12 may be packetized in varying bit formats by the host system 10 and/or host interface circuit 14. For example, the same size data block (i.e., 4096 bits) may be packetized in a "byte-size" format as 512 8-bit data symbols, or "bytes," as well. In this later case, the bit-wide conversion circuit 16 would be designed to reformat the 512 8-bit data symbols into the 410 10-bit data symbols, i.e., at an 8:10 ratio instead of a 16:10 ratio. Alternatively, the data block may be originally packetized by the host system 10 in a 10-bit symbol format, which would eliminate the need for the bit-wide conversion circuit 16 within the data storage and handling system 12.

Whatever the original symbol bit-format of the data block, once converted into 10-bit format, the individual data symbols are transmitted through a 10-bit Reed-Solomon encoder circuit 20, which generates a preferred number r of 10-bit error check symbols based on a preferred generator polynomial, g(x), where r is equal to the polynomial degree of g(x). For purposes of describing the illustrated preferred embodiment, wherein correction of up to two 10-bit data errors by direct hardware solution and up to four 10-bit errors by firmware solution is preferred, an exemplary generator polynomial g(x) of degree r=8 has been selected, where (in factored form):

$$g(x)=(x+\alpha^0)(x+\alpha^1)(x+\alpha^2)(x+\alpha^3)(x+\alpha^4)**(x+\alpha^5)(x+\alpha^6)(x+\alpha^7).$$

While any number of known Reed-Solomon encoder circuits may be utilized to generate the error check symbols, e.g., such as an eight stage linear shift register with feedback, a combined encoder/syndrome generator circuit 20 of the type disclosed in an article entitled "A Combined Reed-Solomon Encoder and Syndrome Generator with Small Hardware Complexity," by G. Fettweis and M. Hassner, p 1871–74, IEEE, 0-7803-0593-0/92 (1992), is preferably employed. An embedded system microprocessor 22 directs the combined encoder/syndrome generator circuit 20 to switch to "encode mode," wherein the encoder circuit 20 divides the 410 10-bit data symbols of the data block by g(x) to produce a "remainder" comprising 8 10-bit error check symbols.

The 8 error check symbols are transmitted through a 10:16 bit wide conversion circuit 24, which serially reformats the 8 10-bit error check symbols into 5 16-bit symbols. The 5 16-bit symbols are then appended to the 256 16-bit data symbols of the original data block in buffer 18, i.e., which were transmitted directly from the host interface circuit 14, the 261 16-bit symbols forming a code word. The code word is released from buffer 18 by the system microprocessor 22 and is stored in a semiconductor based memory store 26, such as, e.g., a "FLASH" RAM. In alternate configurations and embodiments, the data block may be transmitted directly from the host interface circuit 14 into the memory store 26, i.e., without employing a holding buffer, with the reformatted (16-bit) error check symbols appended thereto directly in the memory store 26.

Figure 2:
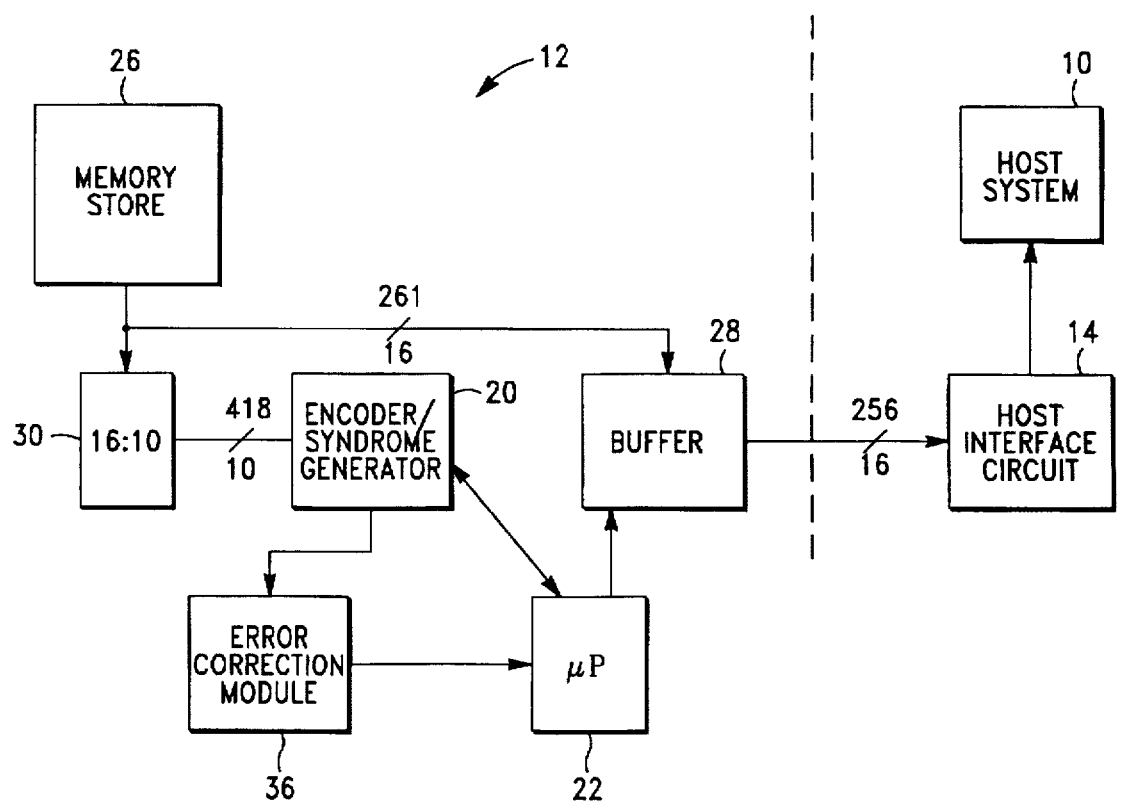
FIG. 2 is a functional block diagram of the memory-to-host (read) circuit of the semiconductor based data storage and retrieval system shown in FIG. 1.

Referring to FIG. 2, the 261 16-bit code word is retrieved from the semiconductor memory store 26 and transmitted into a holding buffer 28, which may be the same buffer as buffer 18. The code word is also transmitted through a 16:10 bit-wide conversion circuit 30. Preferably, holding buffer 28 retains only the first 256 symbols of the code word, i.e., only the symbols comprising the original source data and not the 5 error check symbols, while all 261 symbols are passed through the 16:10 bit-wide conversion circuit 30. The bit-wide conversion circuit 30 reformats the 261*16-bit code word into a 418*10-bit codeword,—i.e., the 410 10-bit source data symbols, including the added four zeros in the 410th symbol, plus the 8 10-bit error check symbols.

The 418 10-bit symbol code word is passed through the combined encoder/syndrome generator 20, which, having been switched to "syndrome" mode by the system microprocessor 22, generates eight 10-bit error syndromes, $S_0$ .. . $S_7$, respectively, therefrom. Other syndrome generation circuitry may alternatively be employed, such as conventional DFT circuits, or the like. The error syndromes are evaluated in the encoder/syndrome generator 20 and, if all syndromes are determined to be zero, (i.e., 80 consecutive zero bits), the retrieved data block is presumed to be error free and the system microprocessor 22 signals the holding buffer 28 to release the 256 16-bit data symbols to the host interface circuit 14. The host interface circuit 14 then transmits the data block to the host system 10 for use in its intended application.

If, however, one or more of the 8 10-bit error syndromes is non-zero, the syndromes are supplied to an error correction module 36 for determination of the location and correct values of the symbol(s) in error. As depicted in the flow chart in FIG. 3, the error correction module 36 executes the "direct solution," or "Peterson Gorenstein Zierler" algorithm, for finding the location(s) and value(s) of up to two 10-bit symbol errors using a hardware solution. If the existence of more than two errors is detected during the error correction routine, the error syndromes are transferred to the system microprocessor 22, which, under firmware control, can determine the correct locations and values of up to four 10-bit symbol errors.

Figure 3:
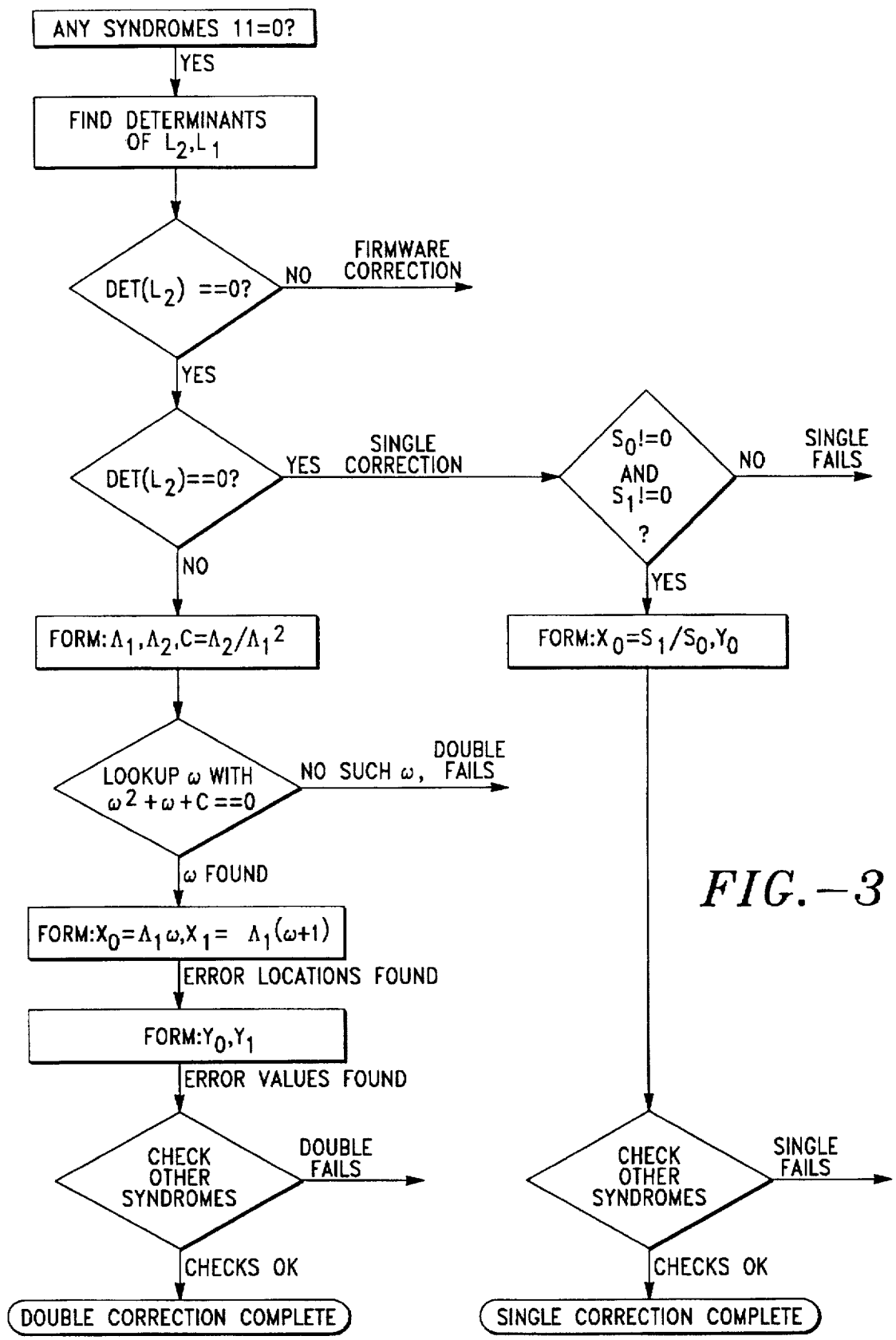
FIG. 3 is a flow chart depicting a preferred error correction process.
Figure 4:
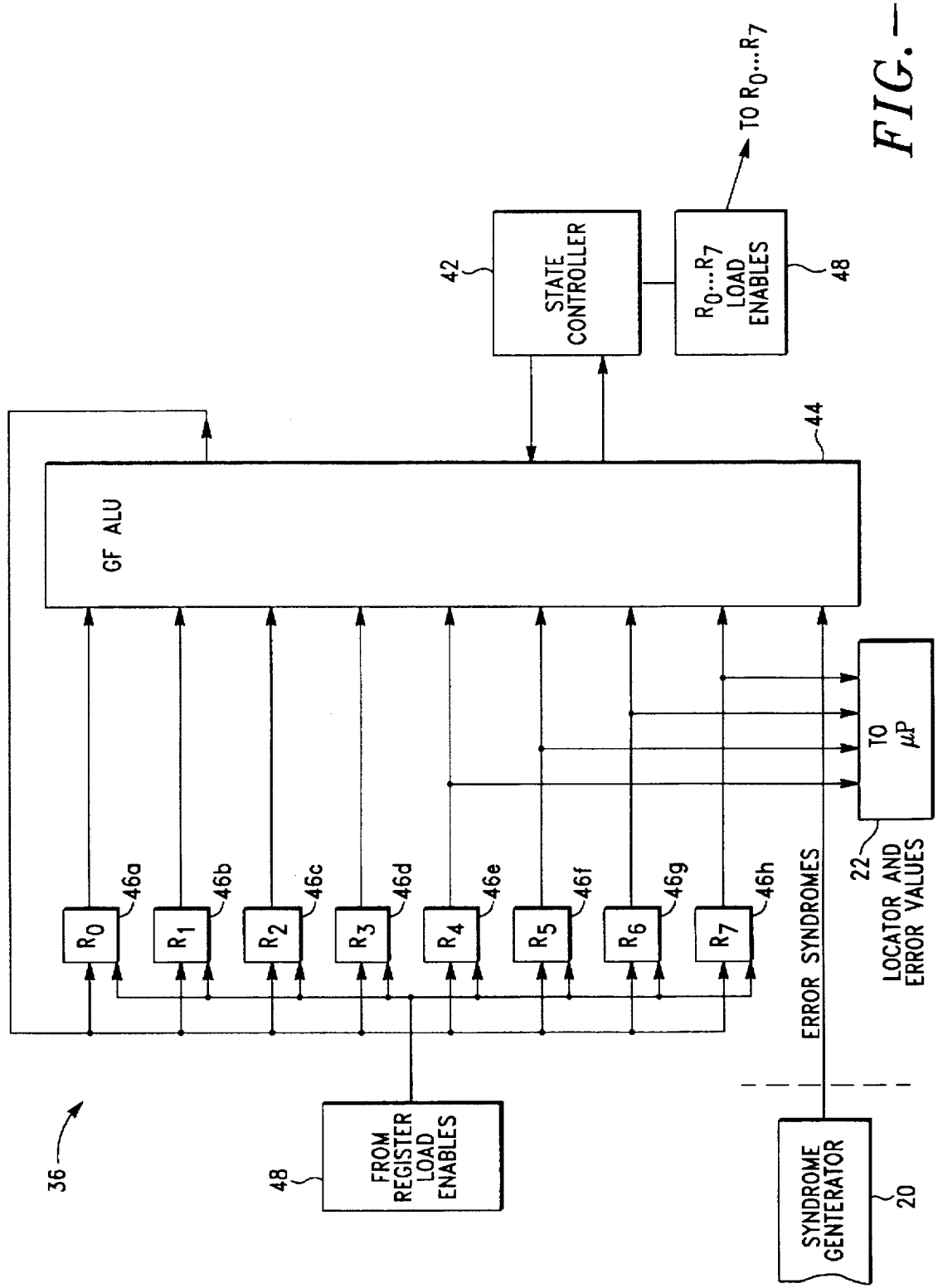
FIG. 4 is a block diagram illustrating the functional system architecture of a preferred error correction module.

Referring to FIG. 4, the error correction module 36 operates under the control of a programmed state controller 42, which directs a specialized 10-bit Galois field arithmetic logic unit 44 ("GF-ALU"), to perform the requisite addition, multiplication, inversion, squaring and table look-up operations necessary to execute the error correction algorithm depicted in FIG. 3. Eight registers, $R_0$–$R_7$, 46a–h, respectively, are provided for holding interim results, with register load enables 48 (not shown in detail) provided to control which register is loaded with the result of the operation from the particular preceding instruction of the state controller 42. In the illustrated preferred embodiment, register $R_0$, 46a, is a dedicated source operand for addition operations and register $R_1$, 46b, is a dedicated source operand for multiplication operations, respectively. Registers $R_4$, 46e, and $R_5$, 46f, respectively, are used for storing the calculated error location (or "locator") values, $X_0$ and (if double error) $X_1$, respectively. Registers $R_6$, 46g, and $R_7$, 46h, respectively, are used for storing the calculated error values, $Y_0$ and (if double error) $Y_1$, respectively. It may be possible to use a different register configuration in alternate embodiments, depending on the order of steps performed.

The following tables list the preferred state instructions given by the state controller 42 to the GF-ALU 44. Table 1 lists the state instructions for the "Double Error Decoding" process, Table 2 includes the state instructions for "Double Error Checking" process, and Table 3 includes the state instructions for "Single Error Decoding and Checking" process, respectively. In the state tables, "st__" identifies each given state; "src" identifies the "source" register or error syndrome, respectively, which contains or comprises the input data to be used in the specified operation. "Inst" refers to the particular instruction, or mathematical operation to be performed by the GF-ALU 44, where "load" calls for loading the input value into a specified register, "mult" calls for multiplying the input value with the contents of register $R_1$, "sqre" calls for squaring the input value, "accm" calls for adding the input value to the contents of register $R_0$, and "noop" calls for a branch to another state if a specified zero or non-zero value is determined. The "dec" entry refers to the specific register location, if any, in which the resulting value of a given state operation is to be stored. The new contents, if any, of the registers following each state operation are also included, as is a brief comment to explain, if necessary, the operation that was performed.

TABLE 1

Double Error Decoding

| st__ | src | inst | dec | $R_0$ | $R_1$ | $R_2$ | $R_3$ | $R_4$ | $R_5$ | $R_6$ | $R_7$ | Comment |
|---|---|---|---|---|---|---|---|---|---|---|---|---|
| 00 | $S_0$ | load | $R_1$ | | $S_0$ | | | | | | | |
| 01 | $S_2$ | mult | $R_0$ | $t_0$ | | | | | | | | $t_0 = S_0 S_2$ |
| 02 | $S_1$ | sqre | R2 | | | $t_1$ | | | | | | $t_1 = S_1^2$ |
| 03 | $R_2$ | accm | R2 | | | $t_2$ | | | | | | $t_2 = S_0 S_2 + S_1^2 = det[M_2]$ |
| 04 | | noop | | | | | | | | | | branch if zero to single solution (st__4E) |
| 05 | $S_3$ | mult | $R_0$ | $t_3$ | | | | | | | | $t_3 = S_0 S_3$ |
| 06 | $S_1$ | load | $R_1$ | | $S_1$ | | | | | | | |
| 07 | $S_2$ | mult | $R_3$ | | | | $t_4$ | | | | | $t_4 = S_1 S_2$ |
| 08 | $R_3$ | accm | $R_3$ | | | | $t_5$ | | | | | $t_5 = S_0 S_3 + S_1 S_2 = $ numerator[$\Lambda_1$] |

TABLE 1-continued

Double Error Decoding

| st_ | src | inst | dec | $R_0$ | $R_1$ | $R_2$ | $R_3$ | $R_4$ | $R_5$ | $R_6$ | $R_7$ | Comment |
|---|---|---|---|---|---|---|---|---|---|---|---|---|
| 09 | | noop | | | | | | | | | | branch if zero to decoder fails (st_66) |
| 0a | $S_3$ | mult | $R_0$ | $t_6$ | | | | | | | | $t_6 = S_1 S_3$ |
| 0b | $S_2$ | sqre | $R_4$ | | | | | $t_7$ | | | | $t_7 = S_2^2$ |
| 0c | $R_4$ | accm | $R_4$ | | | | | $t_8$ | | | | $t_8 = S_1 S_3 + S_2^2 = $ numerator$[\Lambda_2]$ |
| 0d | | noop | | | | | | | | | | branch if zero to decoder fails (st_66) |
| 0e | $R_2$ | invt | $R_1$ | | $t_9$ | | | | | | | $t_9 = 1/\det[M2]$ |
| 0f | $R_3$ | mult | $R_3$ | | | | $t_{10}$ | | | | | $t_{10} = \Lambda_1$ |
| 10 | $R_4$ | mult | $R_4$ | | | | | $t_{11}$ | | | | $t_{11} = \Lambda_2$ |
| 11 | $R_3$ | invt | $R_1$ | | $t_{12}$ | | | | | | | $t_{12} = 1/\Lambda_1$ |
| 12 | S1 | mult | $R_7$ | | | | | | | | $t_{13}$ | $t_{13} = S_1/\Lambda_1$ |
| 13 | $R_1$ | sqre | $R_1$ | | $t_{14}$ | | | | | | | $t_{14} = 1/\Lambda_1^2$ |
| 14 | $R_{14}$ | mult | $R_1$ | | $t_{15}$ | | | | | | | $t_{15} = \Lambda_2/\Lambda_1^2$ |
| 15 | $R_1$ | dbls | $R_1$ | | $t_{16}$ | | | | | | | $t_{16} = $ soln of $y^2 + y + \Lambda_2/\Lambda_1^2 = 0, \omega$ |
| 16 | | noop | | | | | | | | | | branch if zero to decoder fails (st_66) |
| 17 | $R_3$ | mult | $R_4$ | | | | | $t_{17}$ | | | | $t_{17} = \Lambda_1 \omega = X_0$ |
| 18 | $R_4$ | load | $R_0$ | $t_{17}$ | | | | | | | | |
| 19 | $R_3$ | accm | $R_5$ | | | | | | $t_{18}$ | | | $t_{18} = X_0 + \Lambda_1 = X_1$ |
| 1a | S0 | mult | $R_0$ | $t_{19}$ | | | | | | | | $t_{19} = \omega S_0$ |
| 1b | $R_7$ | accm | $R_0$ | $t_{20}$ | | | | | | | | $t_{20} = \omega S_0 + S_1/\Lambda_1 = Y_1$ |
| 1c | | noop | | | | | | | | | | branch if zero to decoder fails (st_66) |
| 1d | $S_0$ | accm | $R_6$ | | | | | | | $t_{21}$ | | $t_{21} = S_0 + Y_1 = Y_0$ |
| 1e | | noop | | | | | | | | | | branch if zero to decoder fails (st_66) |
| 1f | $R_0$ | load | $R_7$ | | | | | | | | $t_{20}$ | store $Y_1$ |

TABLE 2

Double Error Solution Checking

| st_ | src | inst | dec | $R_0$ | $R_1$ | $R_2$ | $R_3$ | $R_4$ | $R_5$ | $R_6$ | $R_7$ | Comment |
|---|---|---|---|---|---|---|---|---|---|---|---|---|
| 20 | $R_4$ | sqre | $R_1$ | | $t_{22}$ | | | | | | | $t_{22} = X_0^2$ |
| 21 | $R_6$ | mult | $R_2$ | | | $t_{23}$ | | | | | | $t_{23} = X_0^2 Y_0$ |
| 22 | $R_5$ | sqre | $R_1$ | | $t_{24}$ | | | | | | | $t_{24} = X_1^2$ |
| 23 | $R_7$ | mult | $R_3$ | | | | $t_{25}$ | | | | | $t_{25} = X_1^2 Y_1$ |
| 24 | $R_3$ | load | $R_0$ | $t_{25}$ | | | | | | | | |
| 25 | $R_2$ | accm | $R_0$ | $t_{26}$ | | | | | | | | $t_{26} = X_0^2 Y_0 + X_1^2 Y_1$ |
| 26 | $S_2$ | accm | $R_0$ | $t_{27}$ | | | | | | | | $t_{27} = S_2 + X_0^1 Y_0 + X_1^2 Y_1$ |
| 27 | | noop | | | | | | | | | | branch if nonzero to decoder fails (st_66 |
| 28 | $R_4$ | load | $R_1$ | | $X_0$ | | | | | | | |
| 29 | $R_2$ | mult | $R_2$ | | | $t_{28}$ | | | | | | $t_{28} = X_0^3 Y_0$ |
| 2a | $R_5$ | load | $R_1$ | | $X_1$ | | | | | | | |
| 2b | $R_3$ | mult | $R_3$ | | | | $t_{29}$ | | | | | $t_{29} = X_1^3 Y_1$ |
| 2c | $R_3$ | load | $R_0$ | $t_{29}$ | | | | | | | | |
| 2d | $R_2$ | accm | $R_0$ | $t_{30}$ | | | | | | | | $t_{30} = X_0^3 Y_0 + X_1^3 Y_1$ |
| 2e | $S_3$ | accm | $R_0$ | $t_{31}$ | | | | | | | | $t_{31} = S_3 + X_0^3 Y_0 + X_1^3 Y_1$ |
| 2f | | noop | | | | | | | | | | branch if nonzero to decoder fails (st_66) |
| 30 | $R_3$ | mult | $R_3$ | | | | $t_{32}$ | | | | | $t_{32} = X_1^4 Y_1$ |
| 31 | $R_4$ | load | $R_1$ | | $X_0$ | | | | | | | |
| 32 | $R_2$ | mult | $R_2$ | | | $t_{33}$ | | | | | | $t_{33} = X_0^4 Y_0$ |
| 33 | $R_3$ | load | $R_0$ | $t_{32}$ | | | | | | | | |
| 34 | $R_2$ | accm | $R_0$ | $t_{34}$ | | | | | | | | $t_{34} = X_0^4 Y_0 + X_1^4 Y_1$ |
| 35 | $S_4$ | accm | $R_0$ | $t_{35}$ | | | | | | | | $t_{35} = S_4 + X_0^4 Y_0 + X_1^4 Y_1$ |
| 36 | | noop | | | | | | | | | | branch if nonzero to decoder fails (st_66) |
| 37 | $R_2$ | mult | $R_2$ | | | $t_{36}$ | | | | | | $t_{36} = X_0^5 Y_0$ |
| 38 | $R_5$ | load | $R_1$ | | $X_1$ | | | | | | | |
| 39 | $R_3$ | mult | $R_3$ | | | | $t_{37}$ | | | | | $t_{37} = X_1^5 Y_1$ |
| 3a | $R_3$ | load | $R_0$ | $t_{37}$ | | | | | | | | |
| 3b | $R_2$ | accm | $R_0$ | $t_{38}$ | | | | | | | | $t_{38} = X_0^5 Y_0 + X_1^5 Y_1$ |
| 3c | $S_5$ | accm | $R_0$ | $t_{39}$ | | | | | | | | $t_{39} = S_5 + X_0^5 Y_0 + X_1^5 Y_1$ |
| 3d | | noop | | | | | | | | | | branch if nonzero to decoder fails(st_66) |
| 3e | $R_3$ | mult | $R_3$ | | | | $t_{40}$ | | | | | $t_{40} = X_1^6 Y_1$ |
| 3f | $R_4$ | load | $R_1$ | | $X_0$ | | | | | | | |
| 40 | $R_2$ | mult | $R_2$ | | | $t_{41}$ | | | | | | $t_{41} = X_0^6 Y_0$ |
| 41 | $R_3$ | load | $R_0$ | $t_{40}$ | | | | | | | | |
| 42 | $R_2$ | accm | $R_0$ | $t_{42}$ | | | | | | | | $t_{42} = X_0^6 Y_0 + X_1^6 Y_1$ |
| 43 | $S_6$ | accm | $R_0$ | $t_{43}$ | | | | | | | | $t_{43} = S_6 + X_0^6 Y_0 + X_1^6 Y_1$ |
| 44 | | noop | | | | | | | | | | branch if nonzero to decoder fails (st_66) |
| 45 | $R_2$ | mult | $R_2$ | | | $t_{44}$ | | | | | | $t_{44} = X_0^7 Y_0$ |

TABLE 2-continued

Double Error Solution Checking

| st__ | src | inst | dec | $R_0$ | $R_1$ | $R_2$ | $R_3$ | $R_4$ | $R_5$ | $R_6$ | $R_7$ | Comment |
|---|---|---|---|---|---|---|---|---|---|---|---|---|
| 46 | $R_5$ | load | $R_1$ | | $X_1$ | | | | | | | |
| 47 | $R_3$ | mult | $R_3$ | | | | | | $t_{45}$ | | | $t_{45} = X_1{}^7Y_1$ |
| 48 | $R_3$ | load | $R_0$ | $t_{45}$ | | | | | | | | |
| 49 | $R_2$ | accm | $R_0$ | $t_{46}$ | | | | | | | | $t_{46} = X_0{}^7Y_0 + X_1{}^7Y_1$ |
| 4a | $S_7$ | accm | $R_0$ | $t_{47}$ | | | | | | | | $t_{47} = S_6 + X_0{}^7Y_0 + X_1{}^7Y_1$ |
| 4b | | noop | | | | | | | | | | branch if nonzero to decoder fails(st__66) |
| 4c | $R_2$ | stat | $R_2$ | | | | | | | | | set status for successful double decoding |
| 4d | | noop | | | | | | | | | | branch to decoding complete (st__67) |

TABLE 3

Double Error Decoding

| st__ | src | inst | dec | $R_0$ | $R_1$ | $R_2$ | $R_3$ | $R_4$ | $R_5$ | $R_6$ | $R_7$ | Comment |
|---|---|---|---|---|---|---|---|---|---|---|---|---|
| 4e | $S_0$ | invt | $R_1$ | | $t_{48}$ | | | | | | | $t_{48} = 1/S_0$ |
| 4f | | noop | | | | | | | | | | | branch if zero to decoder fails (st__66) |
| 50 | $S_1$ | mult | $R_1$ | | $t_{49}$ | | | | | | | $t_{49} = S_1/S_0 = X_0$ |
| 51 | | noop | | | | | | | | | | | branch if zero to decoder fails (st__66) |
| 52 | $S_1$ | mult | | | | | | | | | | | $t_{50} = S_1X_0$ |
| 53 | $S_2$ | accm | $R_0$ | $t_{50}$ | | | | | | | | $t_{51} = S_1X_0 + S_2$ |
| 54 | | noop | $R_0$ | $t_{51}$ | | | | | | | | branch if nonzero to decoder fails (st__66) |
| 55 | $S_2$ | mult | $R_0$ | $t_{52}$ | | | | | | | | $t_{52} = S_2X_0$ |
| 56 | $R_3$ | accm | $R_0$ | $t_{53}$ | | | | | | | | $t_{53} = S_2X_0 + S_3$ |
| 57 | | noop | | | | | | | | | | | branch if nonzero to decoder fails (st__66) |
| 58 | $S_3$ | mult | $R_0$ | $t_{54}$ | | | | | | | | $t_{54} = S_3X_0$ |
| 59 | $S_4$ | accm | $R_0$ | $t_{55}$ | | | | | | | | $t_{55} = S_3X_0 + S_4$ |
| 5a | | noop | | | | | | | | | | | branch if nonzero to decoder fails (st__66) |
| 5b | $S_4$ | mult | $R_0$ | $t_{56}$ | | | | | | | | $t_{56} = S_4X_0$ |
| 5c | $S_5$ | accm | $R_0$ | $t_{57}$ | | | | | | | | $t_{57} = S_4X_0 + S_5$ |
| 5d | | noop | | | | | | | | | | | branch if nonzero to decoder fails (st__66) |
| 5e | $S_5$ | mult | $R_0$ | $t_{58}$ | | | | | | | | $t_{58} = S_5X_0$ |
| 5f | $R_6$ | accm | $R_0$ | $t_{59}$ | | | | | | | | $t_{59} = S_5X_0 + S_6$ |
| 60 | | noop | | | | | | | | | | | branch if nonzero to decoder fails (st__66) |
| 61 | $S_6$ | mult | $R_0$ | $t_{68}$ | | | | | | | | $t_{60} = S_6X_0$ |
| 62 | $S_7$ | accm | $R_0$ | $t_{68}$ | | | | | | | | $t_{61} = S_6X_0 + S_7$ |
| 63 | | noop | | | | | | | | | | | branch if nonzero to decoder fails (st__66) |
| 64 | $R_1$ | stat | $R_1$ | | | | | | | | | set status for successful single error decoding |
| 65 | | noop | | | | | | | | | | | noop unconditional branch to state 67 |
| 66 | $R_0$ | stat | $R_0$ | | | | | | | | | set status to indicate decoder failure |
| 67 | $R_1$ | load | $R_4$ | | | | | $X_0$ | | | | load $X_0$ value into locator output register |
| 68 | $S_0$ | load | $R_6$ | | | | | | | $Y_0$ | | load $Y_0$ value into error value output register |
| 69 | | noop | | | | | | | | | | | decoder complete - idle state |

In the preferred state instructions set forth in Tables 1–3, respectively, there are a total of 106 possible instructions (or "states") to be carried out during execution of the error correction algorithm. The state controller 42 will continue serial execution of instructions, until either a double or single error solution is completed, or until both fail, with the actual number of states depending upon which event occurs. If either the double or single error decoding process is successfully completed, both the location(s) of the 10-bit symbol error(s), $X_0$ and (if double error) $X_1$, respectively, and the correct 10-bit data value(s) for substitution therefor, $Y_0$ and (if double error) $Y_1$, respectively, are obtained from the respective registers $R_4$–$R_7$, 46e–h, by the system microprocessor 22. In the event both double and single solutions fail, the existence of more than two errors is presumed and the eight error syndromes, $S_0$–$S_7$, respectively, are transferred to the system microprocessor 22, which preferably can calculate the locations and correct values of up to four 10-bit symbol errors under firmware control.

Whether calculated by the GF-ALU 44, or by the system microprocessor 22, the corrected data location(s) and value (s), respectively, are substituted for the erroneous data value(s) by the system microprocessor 22, while the retrieved data block is still retained in the holding buffer 28. Because the location(s) and correct value(s), respectively, are calculated based on the 10-bit symbol format, the system microprocessor 22 translates the 10-bit location(s) and value (s) into the corresponding 16-bit location(s) and value(s), before substitution in the data block. The data block is then released from the holding buffer 28 to the host interface circuit 14 and host system 10, respectively, for use in its intended application.

Figure 5:
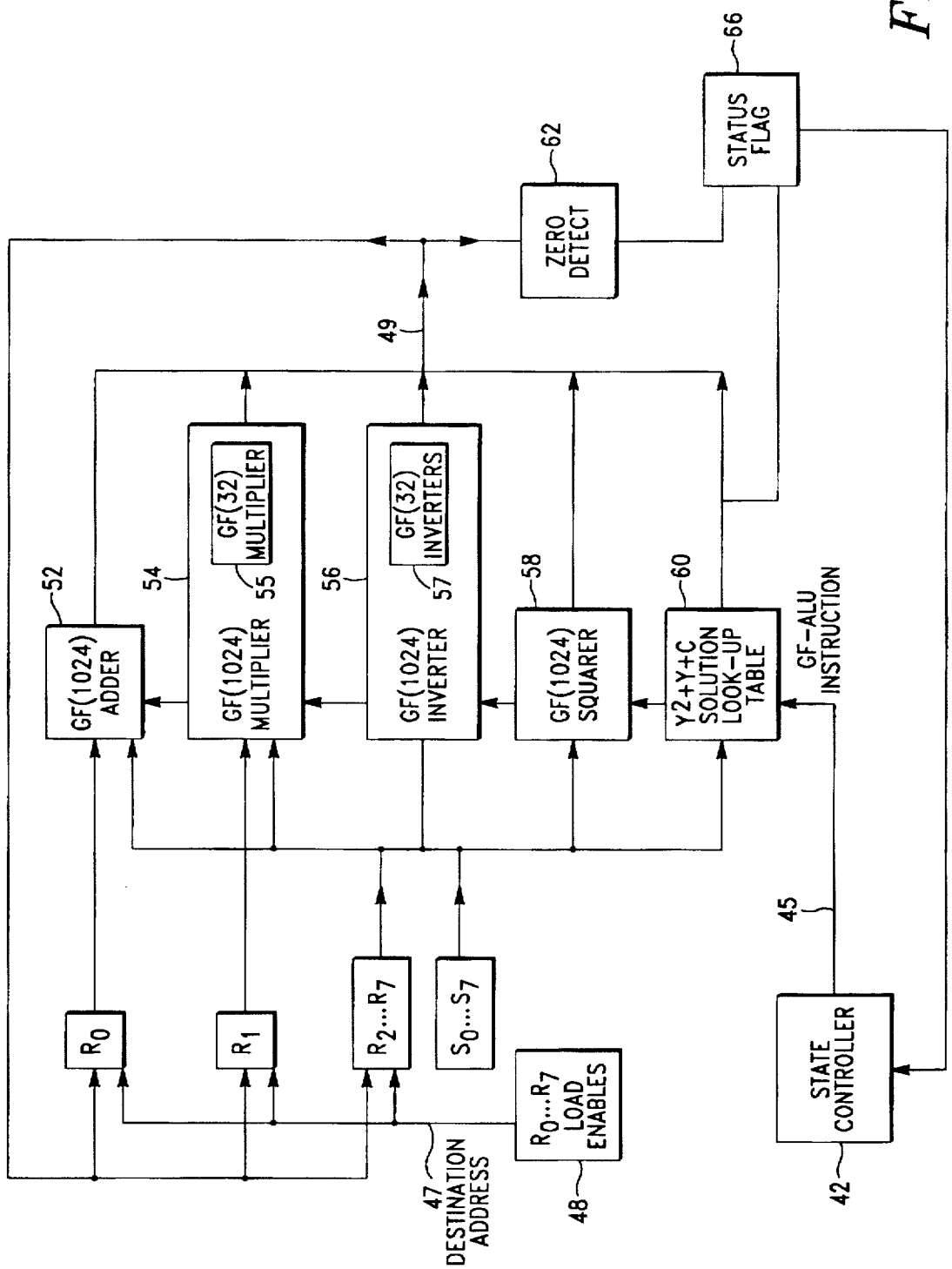
FIG. 5 is a block diagram illustrating the functional system architecture of a preferred Galois field arithmetic logic unit within the error correction module of FIG. 4.

Referring to FIG. 5, the state controller 42 serially invokes each new GF-ALU instruction 45 to the GF-ALU 44. A 10-bit symbol contained either in one of registers, $R_0 \ldots R_7$, 46a–h, respectively, or comprising a particular error syndrome, $S_0 \ldots S_7$, respectively, is used as the input value for the operation indicated in the GF-ALU instruction 45. The possible 10-bit arithmetic operations, i.e. over a Galois field $GF(2^{10})$, or "GF(1024)," include addition 52, which is preferably carried out by X'OR operation, multiplication 54, inversion 56, and squaring 58, respectively, as indicated in the particular state instruction. A $y^2+y+C$ solution table look-up function 60 is also provided in the GF-ALU 44, for finding the quadratic solution(s) in the Galois field $GF(2^{10})$ for a given value of C in the double error decoding process.

After each instruction, the GF-ALU output 49 is loaded into one of registers, $R_0 \ldots R_7$, 46a–h, respectively, which is readied by a destination address 47 sent by the register load enables 48. The GF-ALU output 49 is occasionally checked for a zero or non-zero value by a zero detect circuit 62, in order to verify whether a particular single or double error solution attempt has succeeded or failed, respectively. If either a zero or non-zero value is detected, depending upon the particular state, a status bit or "flag" 66 is sent to the state controller 42, which will set the appropriate status, e.g. "decoder fails," or "successful double/single error decoding," to alert the system microprocessor 22 to obtain the requisite information from either the syndrome generator (if "decoder fails") or the appropriate registers $R_4$–$R_7$, 46e–h, respectively. In certain state operations, the failure to locate a viable solution in the look-up table 60 will also trigger a status flag 66 to be sent.

In accordance with one aspect of the present invention, the operations of the GF-ALU 44 are preferably substantially hardware-minimized by employing 5-bit extension field operations over a Galois field $GF(2^5)$, or GF(32), to assist in performing certain of the 10-bit arithmetic operations. In the illustrated preferred embodiment, the 5-bit extension field operation units include 5-bit multipliers 55, and inverters 57, respectively.

In the 5-bit operations, each 5-bit nibble or "number" is treated in a standard basis as a fourth degree polynomial, i.e., where each 5-bit number, $\{d_4, d_3, d_2, d_1, d_0\}$, is represented as coefficients in the fourth degree polynomial, $d_4x^4+d_3x^3+d_2x^2+d_1x+d_0x^0$. The Galois field $GF(2^5)$, or GF(32), which is defined by an arbitrarily selected first element and a fifth degree generator polynomial, designated herein as "p(x)," is preferably generated based on the irreducible polynomial $x^5+x^2+1$. Its first element $\alpha^1$ (i.e., excluding $\alpha^0$), is selected to be equal to x, where x represents the binary field element in polynomial representation over GF(2), as is known in the art. The 31 possible non-zero field elements are represented by the successive powers of alpha, including $\alpha^0$. Accordingly, each successive element in the field may be determined by multiplying the preceding field element by $\alpha^1$, mod p(x). Put another way, the non-zero field elements are represented by the antilogs of the powers of $\alpha$ from 0 to 31, where each of the antilog values are calculated mod p(x), so that no antilog value can exceed 31, with $\alpha^{31}$ mapping back to $\alpha^0$, (i.e., $\alpha^{31}=\alpha^0=1$). For example:

$\alpha^1 = x^1$ mod $p(x) = 2^1 =$ (binary) 00010;

$\alpha^2 = \alpha^1 \cdot \alpha^1$ mod $p(x) = x^1 \cdot x^1$ mod $p(x) = x^2 = 00100$;

$\alpha^3 = \alpha^2 \cdot \alpha^1$ mod $(p(x)) = 01000$;

$\alpha^4 = \alpha^3 \cdot \alpha^1$ mod $(p(x)) = 10000$;

$\alpha^5 = \alpha^4 \cdot \alpha^1 = x^4 \cdot x^1$ mod $p(x) = x^5$ mod $(x^5+x^2+1) = x^2+1 = 00101$ (etc.).

After the GF(32) antilog table is calculated, generating a log table ("base $\alpha$") is simply a matter of reversing the antilog table by mapping each power of alpha with its corresponding antilog value. Hardware multipliers, inverters and adders for GF(32) with $\alpha^1=x$ and $p(x)=x^5+x^2+1$ over GF(2), are maintained within the GF-ALU 44 to facilitate the 5-bit extension field operations. To facilitate further explanation of the 5-bit extension field operations, the antilog and log tables (decimal) for $GF(2^5)$ are set forth in Tables 4 and 5:

TABLE 4

| Antilog Table/Elements of $GF(2^5)$. | |
|---|---|
| i | $\alpha^i$ |
| 0 | 1 |
| 1 | 2 |
| 2 | 4 |
| 3 | 8 |
| 4 | 16 |
| 5 | 5 |
| 6 | 10 |
| 7 | 20 |
| 8 | 13 |
| 9 | 26 |
| 10 | 17 |
| 11 | 7 |
| 12 | 14 |
| 13 | 28 |
| 14 | 29 |
| 15 | 31 |
| 16 | 27 |
| 17 | 19 |
| 18 | 3 |
| 19 | 6 |
| 20 | 12 |
| 21 | 24 |
| 22 | 21 |
| 23 | 15 |
| 24 | 30 |
| 25 | 25 |
| 26 | 23 |
| 27 | 11 |
| 28 | 22 |
| 29 | 9 |
| 30 | 18 |
| 31 | 1 |

TABLE 5

| Log Table for $GF(2^5)$ | |
|---|---|
| i | LOG[i] |
| 1 | 0/31 |
| 2 | 1 |
| 3 | 18 |
| 4 | 2 |
| 5 | 5 |
| 6 | 19 |
| 7 | 11 |
| 8 | 3 |
| 9 | 29 |
| 10 | 6 |
| 11 | 27 |
| 12 | 20 |
| 13 | 8 |
| 14 | 12 |
| 15 | 23 |
| 16 | 4 |
| 17 | 10 |
| 18 | 30 |
| 19 | 17 |
| 20 | 7 |
| 21 | 22 |

TABLE 5-continued

Log Table for GF($2^5$)

| i | LOG[i] |
|---|--------|
| 22 | 28 |
| 23 | 26 |
| 24 | 21 |
| 25 | 25 |
| 26 | 9 |
| 27 | 16 |
| 28 | 13 |
| 29 | 14 |
| 30 | 24 |
| 31 | 15 |

Preferably, the system microprocessor 22 is also provided with the appropriate Galois field logs and antilogs to facilitate calculations for the three and four error correction routines.

Once the results for GF($2^5$) are determined, the 10-bit multiplication and inversion operations may be easily performed by 5-bit "extension field" operations. In particular, according to another aspect of the present invention, the 10 bit numbers are represented in a standard basis as a sum of powers of "y" over GF($2^5$), with each 10-bit symbol treated as two 5-bit nibbles or "numbers," ($e_0$, $e_1$), which represent $e_1y+e_0$, to perform the requisite multiplication and inversion functions. Preferably, the multiplication of the 10-bit numbers is performed as standard polynomial multiplication, reduced by mod $P_{1024}(y)$, where P(y) is the irreducible polynomial: $P_{1024}(y)=y^2+y+1$, over GF($2^5$).

By way of example, let $m_0$=0101110100 and $m_1$=1001101111. A 10-bit multiply of $m_0*m_1$ is required. According to this aspect of the invention, it is carried out as follows:

$m_0$ = {01011}y + {10100};
$m_1$ = {10011}y + {01111}.
Letting {01011} = a(=(11)dec);
{10100} = b(=(20)dec);
{10011} = c(=(19)dec); and
{01111} = d(=(15)dec);
$m_0 * m_1$ = (ay + b)(cy + d) = $acy^2$ + (bc + ad)y + bd.

$(acy^2 + (bc + ad)y + bd)mod(y^2 + y + 1) =$ $(ac + bc + ad)y + (bd + ac)$.

Each of the two 5-bit products, (i.e., ac, bc, ad, bd), may be determined by referring to the previously generated antilog and log (base α) tables, as follows:

$ac$ = antilog$_α$[(log$_α a$ + log$_α c$)mod(31)]
  = antilog[(27 + 17)mod(31)]
  = antilog[13] = 28.

$bc$ = antilog$_α$[(log$_α b$ + log$_α c$)mod(31)]
  = antilog[(7 + 17)mod(31)]
  = antilog[24] = 30.

$bd$ = antilog$_α$[(log$_α b$ + log$_α d$)mod(31)]
  = antilog[(7 + 23)mod(31)]
  = antilog[30] = 18.

$ad$ = antilog$_α$[(log$_α a$ + log$_α d$)mod(31)]
  = antilog[(27 + 23)mod(31)]
  = antilog[19] = 6.

Addition of the five bit products is performed by standard XOR operation:

$(ac+bc+ad)$={11100}+{11110}+{00110}={00100};

and $(bd+ac)$={10010}+{11100}={01110}.

Concatenating the two results, $m_0*m_1$={0010001110}.

To ensure full disclosure of the aforedescribed preferred embodiment, a corresponding verilog listing of the error correction module 36 is provided as follows:

```
     module decoder(
                      constclk,    /* positive edge byte clock   */
                      decstart,    /* start of decoding          */
                      resetn,      /* decoder negative reset     */
5                    syrs0000,    /* syndrome 0                 */
                      syrs0001,    /* syndrome 1                 */
                      syrs0002,    /* syndrome 2                 */
                      syrs0003,    /* syndrome 3                 */
                      syrs0004,    /* syndrome 4                 */
10                   syrs0005,    /* syndrome 5                 */
                      syrs0006,    /* syndrome 6                 */
                      syrs0007,    /* syndrome 7                 */
                      locater0,    /* locater of first error     */
                      locater1,    /* locater of 2nd error       */
15                   errvalu0,    /* value of first error       */
                      errvalu1,    /* value of 2nd error         */
                      decrstat,    /* decoder status flags       */
                      finished     /* status indicating finished */
                      );

20   input     constclk;
     input     decstart;
     input     resetn;
     input [9:0]  syrs0000;
```

- 35 -

208/297
Patent

```
        input   [9:0]   syrs0001;
        input   [9:0]   syrs0002;
        input   [9:0]   syrs0003;
        input   [9:0]   syrs0004;
5       input   [9:0]   syrs0005;
        input   [9:0]   syrs0006;
        input   [9:0]   syrs0007;
        output  [9:0]   locater0;
        output  [9:0]   locater1;
10      output  [9:0]   errvalu0;
        ouput   [9:0]   errvalu1;
        ouput   [9:0]   decrstat;
        output  [1:0]   finished;

// synopsys state_vector st8
15      parameter [6:0] /* synopsys enum bus_states */
                st_00 = 7'h00, st_01 = 7'h01, st_02 = 7'h02, st_03 = 7'h03,
                st_04 = 7'h04, st_05 = 7'h05, st_06 = 7'h06, st_07 = 7'h07,
                st_08 = 7'h08, st_09 = 7'h09, st_0a = 7'h0a, st_0b = 7'h0b,
                st_0c = 7'h0c, st_0d = 7'h0d, st_0e = 7'h0e, st_0f = 7'h0f,
20              st_10 = 7'h10, st_11 = 7'h11, st_12 = 7'h12, st_13 = 7'h13,
                st_14 = 7'h14, st_15 = 7'h15, st_16 = 7'h16, st_17 = 7'h17,
                st_18 = 7'h18, st_19 = 7'h19, st_1a = 7'h1a, st_1b = 7'h1b,
                st_1c = 7'h1c, st_1d = 7'h1d, st_1e = 7'h1e, st_1f = 7'h1f,
```

- 36 -

208/297
Patent

```
       st_20 =  7'h20, st_21 =  7'h21, st_22 =  7'h22, st_23 =  7'h23,
       st_24 =  7'h24, st_25    =  7'h25, st_26 =  7'h26, st_27 =  7'h27,
       st_28 =  7'h28, st_29 =  7'h29, st_2a =  7'h2a, st_2b =  7'h2b,
       st_2c =  7'h2c, st_2d =  7'h2d, st_2e =  7'h2e, st_2f =  7'h2f,
   5   st_30 =  7'h30, st_31 =  7'h31, st_32 =  7'h32, st_33, =  7'h33,
       st_34 =  7'h34, st_35 =  7'h35, st_36 =  7'h36, st_37 =  7'h37,
       st_38 =  7'h38, st_39 =  7'h39, st_3a =  7'h3a, st_3b, =  7'h3b,
       st_3c =  7'h3c, st_3d =  7'h3d, st_3e =  7'h3e, st_3f =  7'h3f,
       st_40 =  7'h40, st_41 =  7'h41, st_42 =  7'h42, st_43 =  7'h43,
  10   st_44 =  7'h44, st_45 =  7'h45, st_46 =  7'h46, st_47 =  7'h47,
       st_48 =  7'h48, st_49 =  7'h49, st_4a =  7'h4z, st_4b =  7'h4b,
       st_4c =  7'h4c, st_4d =  7'h4d, st_4e =  7'h4e, st_4f =  7'h4f,
       st_50 =  7'h50, st_51 =  7'h51, st_52 =  7'h52, st_53 =  7'h53,
       st_54 =  7'h54, st_55 =  7'h55, st_56 =  7'h56, st_57 =  7'h57,
  15   st_58 =  7'h58, st_59 =  7'h59, st_5a =  7'h5a, st_5b =  7'h5b,
       st_5c =  7'h5c, st_5d =  7'h5d, st_5e =  7'h5e, st_5f =  7'h5f,
       st_60 =  7'h60, st_61 =  7'h61, st_62 =  7'h62, st_63 =  7'h63,
       st_64 =  7'h64, st_65 =  7'h65, st_66 =  7'h66, st_67 =  7'h67,
       st_68 =  7'h68, st_69 =  7'h69, st_6a =  7'h6a, st_6b =  7'h6b,
  20   st_6c =  7'h6c, st_6d =  7'h6d, st_6e =  7'h6e, st_6f =  7'h6f,
       st_70 =  7'h70, st_71 =  7'h71, st_72 =  7'h72, st_73 =  7'h73,
       st_74 =  7'h74, st_75 =  7'h75, st_76 =  7'h76, st_77 =  7'h77,
       st_78 =  7'h78, st_79 =  7'h79, st_7a =  7'h7a, st_7b =  7'h7b,
       st_7c =  7'h7c, st_7d =  7'h7d, st_7e =  7'h7e, st_7f =  7'h7f;
```

```
       reg    [6:0] /*synopsys enum bus_states */ st8, nxst8;

parameter [3:0]

i_r0 = 4'd0, i_r1 = 4'd1, i_r2 = 4'd2, i_r3 = 4'd3, i_r4 = 4'd4, i_r5 = 4'd5, i_r6 = 4'd6, i_r7 = 4'd7, 5              i_s0 = 4'h8, i_s1 = 4'h9, i_s2 = 4'ha, i_s3 = 4'hb, i_s4 = 4'hc, i_s5 = 4'hd, i_s6 = 4'h3, i_s7 = 4'hf;

parameter [2:0]

load = 3'd0, accm = 3'd1, mult = 3'd2, invt = 3'd3, dbls = 3'd4, sqre = 3'd5, stat = 3'd6, noop = 3'd7, 10             o_r0 = 3'd0, o_r1 = 3'd1, o_r2 = 3'd2, o_r3 = 3'd3, o_r4 = 3'd4, o_r5 = 3'd5, o_r6 = 3'd6, o_r7 = 3'd7;

reg [10:0] fnk;

wire [1:0] decrstat;

wire [3:0] sourcadd;

15     wire [2:0] instruct;

wire [2:0] destnadd;

wire       finished;

wire       bz;

wire       nz;

20     wire       instatus;
```

- 38 -

208/297
Patent

```
     assign bz       =  instatus;
     assign nz       =  ~bz;

assign sourcadd  = fnk [10:7];
     assign instruct  = fnk [6:4];
5    assign destnadd  = fnk [3:1];
     assign finished  = fnk [9];

always @(st8 or bz or nz)
        case (st8)  // synopsys full_case parallel_case st_00:begin  nxst8 = st_01; fnk = {i_s0,load,o_r1,1'd0}; end // S0              into R1 multiplier
10      st_01:begin  nxst8 = st_02; fnk = {i_s2,mult,o_r0, 1'd0}; end // S0S2           into R0 accumulator
        st_02:begin  nxst8 = st_03; fnk = {i_s1, sqre,o_r2,1'd0}; end // S1*2           into R2
        st_03:begin  nxst8 = st_04; fnk = {4'h2,accm,o_r2,1'd0};  end // S0S2+S1**2     into R2

/* R2 now contains det(M2]                       */
        /* det[M2[ is nonzero if there are two or more errors   */
15      /* det[M2] is zero if there are one or more thatn 2 errors  */ st_04:begin nxst8 = ({7{bz}}&st_4e)|({7{nz}}&st_05); fnk = {4'h3,load,o_r3,1'd0}; end // noop branch
        st 05:begin nxst8 = st_06; fnk = {i_s3,mult,o_r0,1'd0}; end // S0S3             into R0
        accumulator
        st 06:begin nxst8 = st_07; fnk = {i_s1,load,o_r1,1'd0}; end // S1               into R1
```

- 39 -

208/297
Patent multiplier

```
st_07:begin nxst8 = st_08; fnk = {i_s2,mult,o_r3,1'd0}; end // S1S2                    into R3
st_08:begin nxst8 = st_09; fnk = {4'h3,accm,o_r3,1'd0}; end // S1S2 + S0S3             into R3
```

/* R3 is the numerator of Lambda1                    */
5   /* R3 is zero causes the two error solution to fail   */

```
st_09:begin nxst8 = ({7{bz}}&st_66)|({7{nz}}&st_0a); fnk = {4'h3,load,o_r3,1'd0}; end // noop branch
st_0a:begin nxst8 = st_0b;  fnk = {i_s3,mult,o_r0,1'd0}; end // S1S3                   into R0
``` accumlator

```
st_0b:begin nxst8 = st_0c;  fnk = {i_s2,sqre,o_r4,1'd0}; end // S2**2                  into R4
10  st_0c:begin nxst8 = st_0d;  fnk = {4'h4,accm,o_r4,1'd0}; end // S2**2 + S1S3           into R4
```

/* R4 is the numerator of Lambda2                    */
/* R4 is zero causes the two error solution to fail  */

```
st_0d:begin nxst8 = ({7{bz}}&st_66)|({7{nz}}&st_0e); fnk = {4'h4,load,o_r4,1'd0}; end // nop branch
st_0e:begin nxst8 = st_0f; fnk = {4'h2,invt,o_r1,1'd0}; end // inverse(det|M2|)        into R1
```

15  multiplie

```
st_0f:begin nxst8 = st_10; fnk = {4'h3,mult,o_r3,1'd0}; end // Lambda1                 into R3
st_10:begin nxst8 = st_11; fnk = {4'h4,mult,o_r4,1'd0}; end // Lambda2                 into R4
```

/* now we have equation of the form z**2 + Lambda2 = = 0 to solve */

- 40 -

```
st_11:begin nxst8=st_12; fnk={4'h3,invt,o_r1,1'd0}; end // 1/Lambda1            into R1
multiplie
st_12:begin nxst8=st_13; fnk={i_s1,mult,o_r7,1'd0}; end // S1/Lambda1            into R7
st_13:begin nxst8=st_14; fnk={4'h1,sqre,o_r1,1'd0}; end // 1/(Lambda1**2)        into R1
multiplie
st_14:begin nxst8=st_15; fnk={4'h4,mult,o_r1,1'd0}; end // Lambda2/(Lambda1**2)  into R1
multiplie /* now we have equation of the form y**2 + y + c == 0 to solve       */
/* where c = Lambda2/(Lambda1**)                                     */
/* if one solution exists, we call it w                              */ st_15:begin nxst8=st_16; fnk={4'h1,db1s,o_r1,1'd0}; end // w into R1 multiplier

/* no such solution causes the two error solution to fail            */ st_16:begin nxst8={(7bz}}&st_66)|({7{nz}}&st_17); fnk={4'h1,load,o_r1,1'd0}; end // noop branch
st_17:begin nxst8=st_18; fnk={4'h3,mult,o_r4,1'd0}; end // Lambda1 w  = X0 into R4
st_18:begin nxst8=st_19; fnk={4'h4,load,o_r0,1'd0}; end // X0 into R0 accumulator
st_19:begin nxst8=st_1a; fnk={4'h3,accm,o_r5,1'd0}; end // Lambda1 + X0 = X1 into R5

/* now we have the error locaters done, find error values */
```

208/297
Patent

```
st_1a:begin nxst8 = st_1b; fnk = {i_s0,mult,o_r0,1'd0}; end // S0 w                              into R0
st_1b:begin nxst8 = st_1c; fnk = {4'h7,accm,o_r0,1'd0}; end // S0 w + S1/Lambda1 = Y1    into R0

/* a zero error value causes the two error solution to fail */ st_1c:begin nxst8 = ({7{bz}}&st_66)|({7{nz}}&st_1d); fnk = 4'h0,load,o_r0,1'd0); end // noop branch
st_1d:begin nxst8 = st_1e; fnk = {i_s0,accm,o_r6,1'd0}; end // S0 + Y1 = Y0              into 46

/* zero error value causes the two error solution to fail */ st_1e:begin nxst8 = ({7{bz}}&st_66)|({7{nz}}&st_1f); fnk = {4'h6,load,o_r6,1'd0}; end // noop branch
st_1f:begin nxst8 = st_20; fnk = {4'h0,load,o_r7,1'd0}; end // Y1 moved to standard place, R7

/* double error solution is now complete {R4, R5, R6, R7} = {X0, X1, Y0, Y1}    */
/* check the solution against all syndromes:                                    */ st_20:begin nxst8 = st_21; fnk = {4'h4,sqre,o_r1,1'd0}; end // X0**2                     into R1
multiplie
st_21:begin nxst8 = st_22; fnk = {4'h6,mult,o_r2,1'd0}; end // X0**2 Y0                  into R2
st_22:begin nxst8 = st_23; fnk = {4'h5,sqre,o_r1,1'd0}; end // X1**2                     into R1
multiplie
st_23:begin nxst8 = st_24; fnk = {4'h7,mult,o_r3,1'd0}; end // X1**2 Y1                  into R3
st_24:begin nxst8 = st_25; fnk = {4'h3,load,o_r0,1'd0}; end // X1**2 Y1                  into R0
accumulat
```

- 42 -

208/297
Patent st_25:begin nxst8 = st_26; fnk = {4'h2,accm,o_r0,1'd0}; end // X12 Y1 + X02 Y0     into R0 accumulat st_26:begin nxst8 = st_27; fnk = {i_s2,accm,o_r0,1'd0}; end // S2 + X12 Y1 + X02 Y0 into R0

/* a nonzero value causes the two error solution to fail */

5    st_27:begin nxst8 = ({7{nz}}&st_66)|({7{bz}}&st_28); fnk = 4'h0,load,o_r0,1'd0}; end // noop branch st_28:begin nxst8 = st_29; fnk = {4'h4,load,o_r1,1'd0}; end // X0     into R1 multiplie st_29:begin nxst8 = st_2a; fnk = {4'h2,mult,o_r2,1'd0}; end // X0**3 Y0     into R2 st_2a:begin nxst8 = st_2b; fnk = {4'h5,load,o_r1,1'd0}; end // X1     into R1

10    multiplie st_2b:begin nxst8 = st_2c; fnk = {4'h3,mult,o_r3,1'd0}; end // X1**3 Y1     into R3 st_2c:begin nxst8 = st_2d; fnk = {4'h3,load,o_r0,1'd0}; end // X13 Y1     into R0 accumulat st_2d:begin nxst8 = st_2e; fnk = {4'h2,addm,o_r0,1'd0}; end // X13 Y1 + X0**3 Y0     into R0

15    accumulat st_2e:begin nxst8 = st_2f; fnk = {i_s3,accm,o_r0,1'd0}; end // S3 + X13 Y1 + X03 Y0 into R0

/* a nonzero value causes the two error solution to fail */ st_2f:begin nxst8 = ({7{nz}}&st_66|({7{bz}}&st_30); fnk = 4'h0,load,o_r0,1'd0}; end // noop branch st_30:begin nxst8 = st_31; fnk = {4'h3,mult,o_r3,1'd0}; end // X1**4 Y1     into R3

20    st_31:begin nxst8 = st_32; fnk = {4'h4,load,o_r1,1'd0}; end // X0     into R1

- 43 - multiplie st_32:begin nxst8 = st_33; fnk = {4'h2,mult,o_r2,1'd0}; end // X0**4 Y0    into R2 st_33:begin nxst8 = st_34; fnk = {4'h3,load,o_r0,1'd0}; end // X1**4 Y1    into R0 accumulat st_34:begin nxst8 = st_35; fnk = {4'h2,accm,o_r0,1'd0}; end // X14 Y1 + X04 Y0    into R0 accumulat st_35:begin nxst8 = st_36; fnk = {i_s4,accm,o_r0,1'd0}; end // S4 + X14 Y1 + X04 Y0 into R0

/* a nonzero value causes the two error solution to fail */ st_36:begin  nxst8 = ({7{nz}}&st_66|({7{bz}}&st_37); fnk = {4'h0,load,o_r0,1'd0}; end // noop branch st_37:begin  nxst8 = st_38; fnk = {4'h2,mult,o_r2,1'd0}; end // X0**5 Y0    into R2 st_38:begin  nxst8 = st_39; fnk = {4'h5,load,o_r1,1'd0}; end // X1    into R1 multiple st_39:begin  nxst8 = st_3a; fnk = {4'h3,mult,o_r3,1'd0}; end // X1**5 Y1    into R3 st_3a:begin  nxst8 = st_3b; fnk = {4'h3,load,o_r0,1'd0}; end // X1**5 Y1    into R0 accumulat st_3b:begin  nxst8 = st_3c; fnk = {4'h2,accm,o_r0,1'd0}; end // X15 Y1 + X05 Y0    into R0 accumulat st_3c:begin  nxst8 = st_3d; fnk = {i_s5,accm,o_r0,1'd0}; end // S5 + X15 Y1 + X05 Y0 into R0

/* a nonzero value causes th two error solution to fail */ st_3d:begin  nxst8 = ({7nz}}&st_66|({7{bz}}&st_3e); fnk = {4'h0,load,o_r0,1'd0}; end // noop branch

- 44 -

208/297
Patent

```
st_3e:begin  nxst8 = st_3f; fnk = {4'h3,mult,o_r3,1'd0}; end // X1**6 Y1              into R3
st_3f:begin  nxst8 = st_40; fnk = {4'h4,load,o_r1,1'd0}; end // X0                    into R1
multiplie
st_40:begin  nxst8 = st_41; fnk = {4'h2,mult,o_r2,1'd0}; end // X0**6 Y0              into R2
st_41:begin  nxst8 = st_42; fnk = {4'h3,load,o_r0,1'd0}; end // X1**6 Y1              into R0
accumulat
st_42:begin  nxst8 = st_43; fnk = {4'h2,accm,o_r0,1'd0}; end // X1**6 Y1 + X0**6 Y0   into R0
accumulat
st_43:begin  nxst8 = st_44; fnk = {i_s6,accm,o_r0,1'd0}; end // S6 + X1**6 Y1 + X0**6 Y0 into R0
```

/* a nonzero value causes the tow error solution to fail */

```
st_44:begin  nxst8 = {{7{nz}}&st_66}|{{7{bz}}&st_45}; fnk = {4'h0,load,o_r0,1'd0}; end // noop branch
st_45:begin  nxst8 = st_46; fnk = {4'h2,mult,o_r2,1'd0}; end // X0**7 Y0              into R2
st_46:begin  nxst8 = st_47; fnk = {4'h5,load,o_r1,1'd0}; end // X1                    into R1
multiplie
st_47:begin  nxst8 = st_48; fnk = {4'h3,mult,o_r3,1'd0}; end // X1**7 Y1              into R3
st_48:begin  nxst8 = st_49; fnk = {4'h3,load,o_r0,1'd0}; end // X1**7 Y1              into R0
accumulat
st_49:begin  nxst8 = st_4a; fnk = {4'h2,accm,o_r0,1'd0}; end // X1-*7 Y1 + X0**7 Y0   into R0
accumulat
st_4a:begin  nxst8 = st_4b; fnk = {i_s7,accm,o_r0,1'd0}; end // S7 + X1**7 Y1 + X0**7 Y0 into R0
```

/* a nonzero value causes the two error solution to fail */

- 45 -

```
st_4b:begin  nxst8 = ({7{nz}}&st_66|({7{bz}}&st_4c); fnk = {4'h0,load,o_r0,1'd0}; end // noop branch
st_4c:begin  nxst8 = st_4d; fnk = {4'h2,stat,o_r2,1'd0}; end // set status register to 2 errors
st_4d:begin  nxst8 = st_69; fnk = {4'h2,load,o_r2,1'd0}; end // noop unconditional branch /* start single error decoding */ st_4e:begin nxst8 = st_4f; fnk = {i_s0,invt,o_r1,1'd0}; end // 1/S0                    into R1
multiplie /* a zero value causes the single error solution to fail */ st_4f:begin  nxst8 = ({7{bz}}&st_66)|({7{nz}}&st_50); fnk = {4'h1,load,o_r1'1'd0}; end // noop branch
st_50:begin  nxst8 = st_51; fnk = {i_s1,mult,o_r1,1'd0}; end // S1/S0 = X0            into R1
multiplie /* a zero value causes the single error solution to fail */ st_51:begin  nxst8 = ({7{bz}}&st_66)|({7{nz}}&st_52); fnk = {4'h1,load,o_r1,1'd0}; end // noop branch
st_52:begin  nxst8 = st_53; fnk = {i_s1,mult,o_r0,1'd0}; end // S1 X0                  into R0
accumulat
st_53:begin  nxst8 = st_54; fnk = {i_s2,accm,o_r0,1'd0}; end // S1 X0 + S2             into R0
accumulat /* a nonzero value causes the single error solution to fail */
```

- 46 -

208/297
Patent st_54:begin nxst8 = ({7{nz}}&st_66)|({7{nz}}&st_55); fnk = {4'h1,load,o_r1,1'd0}; end // noop branch st_55:begin nxst8 = st_56; fnk = {i_s2,mult,o_r0,1'd0}; end // S2 X0                into R0
accumulat st_56:begin nxst8 = st_57; fnk = {i_s3,accm,o_r0,1'd0}; end // S2 X0 + S3           into R0

5   accumulat

/* a nonzero value causes the single error solution to fail */ st_57:begin nxst8 = ({7{nz}}&st_66)|({7{bz}}&st_58); fnk = {4'h1,load,o_r1,1'd0}; end // noop branch st_58:begin nxst8 = st_59; fnk = {i_s3,mult,o_r0,1'd0}; end // S3 X0                into R0
accumulat 10  st_59:begin nxst8 = st_5a; fnk = {i_s4,accm,o_r0,1'd0}; end // S3 X0 + S4         into R0
accumulat /* a nonzero value causes the single error solution to fail */ st_5a:begin nxst8 = ({7{nz}}&st_66|({7bz}}&st_5b); fnk = {4'h1,load,o_r1,1'd0}; end // noop branch st_5b:begin nxst8 = st_5c; fnk = {i_s4,mult,o_r0,1'd0}; end // S4 X0                into R0

15  accumulat st_5c:begin nxst8 = st_5d; fnk = {i_s5,accm,o_r0,1'd0}; end // S4 X0 + S5           into R0
accumulat /* a nonzero value causes the single error solution to fail */

- 47 -

208/297
Patent

```
st_5d:begin  nxst8 = ({7{nz}}&st_66|({7{bz}}&st_5e); fnk = {4'h1,load,o_r1,1'd0}; end // noop branch
st_5e:begin  nxst8 = st_5f; fnk = {i_s5,mult,o_r0,1'd0}; end // S5 X0                into R0
accumulat
st_5f:begin  nxst8 = st_60; fnk = {i_s6,accm,o_r0,1'd0}; end // S5 X0 + S6           into R0
accumulat /* a nonzero value causes the single error solution to fail */ st_60:begin  nxst8 = ({7{nz}}&st_66|({7bz}}&st_61; fnk = 4'h1,load,o_r1,1'd0}; end // noop branch
st_61:begin  nxst8 = st_62; fnk = {i_s6,mult,o_r0,1'd0}; end // S6 X0                into R0
accumulat
st_62:begin  nxst8 = st_63; fnk = s7,accm,o_r0,1'd0}; end // S6 X0 + S7              into R0
accumulat /* a nonzero value causes the single error solution to fail */ st_63:begin  nxst8 = ({7{nz}}&st_66|({7{bz}}&st_64; fnk = {4'h1,load,o_r1,1'd0}; end // noop branch
st_64:begin  nxst8 = st_65; fnk = {4'h1,stat,o_r1,1'd0}; end // set status register to 1 error
st_65:begin  nxst8 = st_67; fnk = {4'h1,load,o_r1,1'd0}; end // noop unconditional branch st_66:begin  nxst8 = st_69; fnk = {4'h0,stat,o_r0,1'd0}; end // decoder failure: set status to 0
st_67:begin  nxst8 = st_68; fnk = {i_r1,load,o_r4,1'd0}; end // load r1 value into r4 locater output
st_68:begin  nxst8 = st_69; fnk = {i_s0,load,o_r6,1'd0}; end // load S0 value into r4 locater output
st_69:begin  nxst8 = st_69; fnk = {4'h0,load,o_r0,1'd1}; end // decoder complete
```

- 48 -

208/297
Patent

```
        endcase always @ (posedge constclk or negedge resetn)
            begin
                if (!resetn)
5                   st8 <= st_69;
                else if (finished && decstart)
                    st8 <= 7'd0;
                else
                    st8 <= nxst8;
10          end gf_alu myIstalu(
                .resetn (resetn),
                .syrs0000(syrs0000),
                .syrs0001(syrs0001),
15              .syrs0002(syrs0002),
                .syrs0003(syrs0003),
                .syrs0004(syrs0004),
                .syrs0005(syrs0005),
                .syrs0006(syrs0006),
20              .syrs0007(syrs0007),
                .locater0(locater0),
                .locater1(locater1),
```

- 49 -

```
            .errvalu0(errvalu0),
            .errvalu1(errvalu1),
            .decodclk(constclk),
            .instruct(instruct),
5           .sourcadd(sourcadd),
            .destnadd(destnadd),
            .decrstat(decrstat),
            .instatus(instatus);
       endmodule 10     module gf_alu (syrs0000,     /* syndrome 0                         */
                     syrs0001,      /* syndrome 1                         */
                     syrs0002,      /* syndrome 2                         */
                     syrs0003,      /* syndrome 3                         */
                     syrs0004,      /* syndrome 4                         */
15                   syrs0005,      /* syndrome 5                         */
                     syrs0006,      /* syndrome 6                         */
                     syrs0007,      /* syndrome 7                         */
                     locater0,      /* register 4 of ALU                  */
                     locater1,      /* register 5 of ALU                  */
20                   errvalu0,      /* register 6 of ALU                  */
                     errvalu1,      /* register 7 of ALU                  */
                     decodclk,      /* alu positive edge clock 20 Mhz     */
                     instruct,      /* instruction to be executed         */
```

208/297
Patent

```
                   sourcadd,    /* address of source operand           */
                   destnadd,    /* address of destination operand      */
                                decrstat, /* status of decoder         */
                   instatus     /* status of completed instruction     */
5                  );
     input         resetn;
     input  [9:0]  syrs0000;
     input  [9:0]  syrs0001;
     input  [9:0]  syrs0002;
10   input  [9:0]  syrs0003;
     input  [9:0]  syrs0004;
     input  [9:0]  syrs0005;
     input  [9:0]  syrs0006;
     input  [9:0]  syrs0007;
15   input         decodclk;
     input  [2:0]  instruct;
     input  [3:0]  sourcadd;
     input  [2:0]  destnadd;

output [9:0]  locater0;
20   output [9:0]  locater1;
     output [9:0]  errvalu0;
     output [9:0]  errvalu1;
     output [1:0]  decrstat;
```

- 51 -

```
      output       instatus;

//reg        instatus;
      reg  [9:0]   workreg0;
      reg  [1:0]   decrstat;
5     reg  [9:0]   workreg1;
      reg  [9:0]   workreg2;
      reg  [9:0]   workreg3;
      reg  [9:0]   workreg4;
      reg  [9:0]   workreg5;
10    reg  [9:0]   workreg6;
      reg  [9:0]   workreg7;
      reg          instatus;
      reg  [9:0]   sourcer;
      reg  [9:0]   aluout;
15    reg          status;

// instruction 0 destination <= source
      wire [9:0]   accumul;     // instruction 1 destination <= sourcer accumulated w output 0
      wire [9:0]   product;     // instruction 2 destination <= sourcer multiplied by output 1
      wire [9:0]   inverse;     // instruction 3 destination <= inverse of sourcer
20    wire [9:0]   dblsoln;     // instruction 4 destination <= soln of (y**2 + y + sourcer == 0)
      wire [9:0]   squared;     // instruction 5 destination <= sourcer**2
                                // instruction 6 no operation
```

208/297
Patent

```
                        // instruction 7 no operation wire iszero;

wire noroot;

wire statenab;

5      wire   [7:0]   regenab;

assign locater0 = workreg4;

assign locater1 = workreg5;

assign errvalu0 = workreg6;

assign errvalu1 = workreg7;

10     /* get source operand */ always @(sourcadd or workreg0 or workreg1 or workreg2 or workreg3 or workreg4 or workreg5 or workreg6 or workreg7 or syrs0000 or syrs0001 or syrs0002 or syrs0003 or 15            syrs0004 or syrs0005 or syrs0006 or syrs0007)

begin case (sourcadd)

4'd0 : sourcer = workreg0;

4'd1 : sourcer = workreg1;

20            4'd2 : sourcer = workreg2;

4'd3 : sourcer = workreg3;
```

- 53 -

```
            4'd4  : sourcer = workreg4;

4'd5  : sourcer = workreg5;

4'd6  : sourcer = workreg6;

4'd7  : sourcer = workreg7;

4'd8  : sourcer = syrs0000;

4'd9  : sourcer = syrs0001;

4'd10 : sourcer = syrs0002;

4'd11 : sourcer = syrs0003;

4'd12 : sourcer = syrs0004;

4'd13 : sourcer = syrs0005;

4'd14 : sourcer = syrs0006;

4'd15 : sourcer = syrs0007;

endcase end

/* computation units */ assign      accumul = workreg0 ^ sourcer;

multiply    decmultr(.x(workreg1), .y(sourcer), .z(product));

inverse         decinvrt(.y(sourcer), .z(inverse));

dbltrbl     dectable(.c(sourcer), .y(dblsoln), .noroot));

squarer         decsquar(.x(sourcer), .z(squared));

/* assign alu output and status */
```

208/297
Patent

```
        always @(instruct or
                sourcer or
                accumul or
                product or
5               inverse or
                dblsoln or
                squared or
                noroot or
                iszero)
10      begin
                case (instruct)
                        3'd0 : begin aluout = sourcer; status = iszero; end
                        3'd1 : begin aluout = accumul; status = iszero; end
                        3'd2 : begin aluout = product; status = iszero; end
15                      3'd3 : begin aluout = inverse; status = iszero; end
                        3'd4 : begin aluout = dblsoln; status = noroot; end
                        3'd5 : begin aluout = squared; status = iszero; end
                        3'd6 : begin aluout = sourcer; status = 1'd0;   end
                        3'd7 : begin aluout = 9'd0;    status = 1'd0;   end
20              endcase
        end /* assign iszero as zero output of alu */
```

- 55 -

208/297
Patent

```
        assign iszero = ~(| aluout);

/* assign output register enables */ assign statenab      = (instruct = = 3'd6);

assign regenab[0] = (destnadd = = 3'd0);
5       assign regenab[1] = (destnadd = = 3'd1);
        assign regenab[2] = (destnadd = = 3'd2);
        assign regenab[3] = (destnadd = = 3'd3);
        assign regenab[4] = (destnadd = = 3'd4);
        assign regenab[5] = (destnadd = = 3'd5);
10      assign regenab[6] = (destnadd = = 3'd6);
        assign regenab[7] = (destnadd = = 3'd7);

/* update outputisters */ always @ (posedge decodclk)
            begin
15              //Note: add reset for workreg0 only, since a known value is
                //needed here during initialization.
                if  (resetn = = 0)
                    workreg0 < = 10'h000;
                else
```

- 56 -

```
                workreg0 <= ({10{regenab[0]}} & aluout | ({10{~regenab[0]}} & workreg0);
                workreg1 <= ({10{regenab[1]}} & aluout | ({10{~regenab[1]}} & workreg1);
                workreg2 <= ({10{regenab[2]}} & aluout | ({10{~regenab[2]}} & workreg2);
                workreg3 <= ({10{regenab[3]}} & aluout | ({10{~regenab[3]}} & workreg3);
                workreg4 <= ({10{regenab[4]}} & aluout | ({10{~regenab[4]}} & workreg4);
                workreg5 <= ({10{regenab[5]}} & aluout | ({10{~regenab[5]}} & workreg5);
                workreg6 <= ({10{regenab[6]}} & aluout | ({10{~regenab[6]}} & workreg6);
                workreg7 <= ({10{regenab[7]}} & aluout | ({10{~regenab[7]}} & workreg7);
                instatus <= status;

if (statenab)
                        decrstat <= sourcadd[1:0];
        end endmodule module multiply (x, y, z); // galois field multiplier of x and y to get z input   [9:0] x;
        input   [9:0] y;
        input   [9:0] z;

wire [4:0] 1sb0;
        wire [4:0] msb0;
```

- 57 -

208/297
Patent

```
     wire [4:0] lsb1;
     wire [4:0] msb1;
     wire [4:0] msb0msb1;
     wire [4:0] lsb0lsb1;
5    wire [4:0] msb0lsb1;
     wire [4:0] msb1lsb0;
     wire [4:0] p0m0m1;
     wire [4:0] p1m0m1;

assign lsb0 = x[4:0];
10   assign lsb1 = y[4:0];
     assign msb0 = x[9:5];
     assign msb1 = y[9:5];

gatemul5 subm0( .x(lsb0), .y(lsb1), .z(lsb0lsb1));
     gatemul5 subm1( .x(msb0), .y(msb1), .z(msb0msb1));
15   gatemul5 subm2( .x(lsb0), .y(msb1), .z(lsb1lsb0));
     gatemul5 subm4( .x(msb0), .y(lsb1), .z(msb0lsb1));
     assign p0m0m1 = msb0msb1;
     assign p1m0m1 = msb0msb1;

assign z[4:0] = lsb0lsb1 ^ p0m0m1;
20   assign z[9:5] = msb0lsb1 ^ msb1lsb0 ^ p1m0m1;
```

- 58 - endmodule module gatemul5(x, y, z); // galois field multiplier of x and y to get z

```
      input  [4:0] x;
      input  [4:0] y;
5     input  [4:0] zx;

wire [4:0] alpha0x;
      wire [4:0] alpha1x;
      wire [4:0] alpha2x;
      wire [4:0] alpha3x;
10    wire [4:0] alpha4x;

assign alpha0x = x;
      assign alpha1x = {alpha0x[3:0],1'b0} ^ ({5{alpha0x[4]}} & 5'd5);
      assign alpha2x = {alpha1x[3:0],1'b0} ^ ({5{alpha1x[4]}} & 5'd5);
      assign alpha3x = {alpha2x[3:0],1'b0} ^ ({5{alpha2x[4]}} & 5'd5);
15    assign alpha4x = {alpha3x[3:0],1'b0} ^ ({5{alpha3x[4]}} & 5'd5);

assign z[0] =
            (alpha0x[0] & y[0]) ^
            (alpha1x[0] & y[1]) ^
            (alpha2x[0] & y[2]) ^
```

- 59 -

208/297
Patent

```
            (alpha3x[0] & y[3]) ^
            (alpha4x[0] & y[4]);

assign z[1] =
            (alpha0x[1] & y[0]) ^
5           (alpha1x[1] & y[1]) ^
            (alpha2x[1] & y[2]) ^
            (alpha3x[1] & y[3]) ^
            (alpha4x[1] & y[4]);

assign z[2] =
10          (alpha0x[2] & y[0]) ^
            (alpha1x[2] & y[1]) ^
            (alpha2x[2] & y[2]) ^
            (alpha3x[2] & y[3]) ^
            (alpha4x[2] & y[4]);

15      assign z[3] =
            (alpha0x[3] & y[0]) ^
            (alpha1x[3] & y[1]) ^
            (alpha2x[3] & y[2]) ^
            (alpha3x[3] & y[3]) ^
20          (alpha4x[3] & y[4]);
```

- 60 -

208/297
Patent

```
   assign z[4] =
          (alpha0x[4] & y[0]) ^
          (alpha1x[4] & y[1]) ^
          (alpha2x[4] & y[2]) ^
5         (alpha3x[4] & y[3]) ^
          (alpha4x[4] & y[4]);

endmodule module squarer(x, z);
   input  [9:0] x;
10 output [9:0] z;
   assign z =    ({10{x[0]}} & 10'd1)   ^
                 ({10{x[1]}} & 10'd4)   ^
                 ({10{x[2]}} & 10'd16)  ^
                 ({10{x[3]}} & 10'd10)  ^
15               ({10{x[4]}} & 10'd13)  ^
                 ({10{x[5]}} & 10'd33)  ^
                 ({10{x[6]}} & 10'd132) ^
                 ({10{x[7]}} & 10'd528) ^
                 ({10{x[8]}} & 10'd330) ^
20               ({10{x[9]}} & 10'd429) ^
   endmodule
```

- 61 -

208/297
Patent

```
    module inverse (y, z); // galois field inverter of y to get z input  [9:0] y;
    input  [9:0] z;

wire [4:0] lsb;
5   wire [4:0] msb;
    wire [4:0] lsblsb;
    wire [4:0] msbmsb;
    wire [4:0] lsbmsb;
    wire [4:0] p1msb;
10  wire [4:0] denom;
    wire [4:0] numer;
    wire [4:0] p0msbmsb;
    wire [4:0] p1lsbmsb;
    wire [4:0] 1it1invt;

15  assign lsb = y[4:0];
    assign msb = y[9:5];

gatemul5 subm0( .x(lsb), .y(lsb), .z(lsb0lsb));
    gatemul5 subm1( .x(msb), .y(msb), .z(msbmsb));
    assign p1msb = msb;
```

- 62 -

```
         gatemul5 subm4( .x(p1msb), .y(1sb), .z(p11sbmsb));
         assign p0msbmsb = msbmsb;

assign number = 1sb ^p1msb;
         assign denom = 1sb1sb ^ p0msbmsb ^p11sbmsb;

5        gf32inv inv0(.x(denom), .z(litlinvt));

gatemul5 subm5( .x(1it1invt), .y(numer), .z([4:0]));
         gatemul5 subm6( .x(1it1invt), .y(msb),   .z(z[9:5]));

endmodule module gf32inv(x, z);
10       input   [4:0] x;
         output        [4:0] z;
         reg     [4:0] z;
         always @(x)
            begin
15             case (x)
                  5,b00000 : z = 5'b00000;
                  5,b00001 : z = 5'b00001;
                  5,b00010 : z = 5'b10010;
                  5,b00011 : z = 5'b11100;
```

- 63 -

208/297
Patent

```
        5,b00100 : z = 5'b01001;
        5,b00101 : z = 5'b10111;
        5,b00110 : z = 5'b01110;
        5,b00111 : z = 5'b01100;
    5   5,b01000 : z = 5'b10110;
        5,b01001 : z = 5'b00100;
        5,b01010 : z = 5'b11001;
        5,b01011 : z = 5'b10000;
        5,b01100 : z = 5'b00111;
   10   5,b01101 : z = 5'b01111;
        5,b01110 : z = 5'b00110;
        5,b01111 : z = 5'b01101;
        5,b10000 : z = 5'b01011;
        5,b10001 : z = 5'b11000;
   15   5,b10010 : z = 5'b00010;
        5,b10011 : z = 5'b11101;
        5,b10100 : z = 5'b11110;
        5,b10101 : z = 5'b11010;
        5,b10110 : z = 5'b01000;
   20   5,b10111 : z = 5'b00101;
        5,b11000 : z = 5'b10001;
        5,b11001 : z = 5'b01010;
        5,b11010 : z = 5'b10101;
        5,b11011 : z = 5'b11111;
```

- 64 -

```
            5,b11100 : z = 5'b00011;
            5,b11101 : z = 5'b10011;
            5,b11110 : z = 5'b10100;
            5,b11111 : z = 5'b11011;
5        endcase
       end
     endmodule module dbltrbl (c, y, noroot);
     input [9:0] c;
10   output [9:0 y;
     output     noroot;
     assign noroot = c[8] ^ c[5];
     assign y[90]  = 1'd0
     assign y[1]   = c[7] ^ c[4] ^ c[2];
15   assign y[2]   = c[7] ^ c[6] ^ c[4] ^ c[3];
     assign y[3]   = c[9] ^ c[6] ^ c[4] ^ c[2] ^ c[1];
     assign y[7]   = c[9] ^ c[5];
     assign y[9]   = c[5];
     assign y[6]   = c[9] ^ c[7];
20   assign y[8]   = y[6] ^ c[6];
     assign y[4]   = y[6] ^ c[6] ^ c[5] ^ c[3];
     assign y[5]   = y[8] ^ c[3] ^ c[0];
     endmodule
```

- 65 -

Thus, an error correction methodology and system architecture for implementing a 10-bit Reed-Solomon code has been disclosed. While the foregoing detailed description was directed to a semiconductor based data storage and retrieval system, it will be apparent to those skilled in the art that the described error correction methodology and architecture can be effectively practiced with any digital data storage system, e.g., such as magnetic or optical based memory systems, as well as with any system involving the handling, transfer, and/or storage of blocks of digital data between elements thereof, including digital communications systems, where the correction of data being transmitted or stored is required. While the present invention is particularly well suited for systems and architectures encountering non-bursty, substantially random data errors, it may be equally employed in those systems and architectures encountering bursty error patterns, as well.

Thus, it would be apparent to those skilled in the art that many more modifications are possible without departing from the inventive concepts herein. The invention, therefore, is not to be restricted except in the spirit of the appended claims.

What is claimed is:

1. An adjunct data block storage and retrieval system for connection to a host computer via an interface, the system for receiving, storing and retrieving, respectively, digital data packetized in a plurality of blocks of k m-bit data symbols, comprising:

a data path connected to the interface, first reformatting means connected to the data path for reformatting the blocks of m-bit data symbols into blocks of 10-bit data symbols;

an encoder connected to the first reformatting means and having means for generating r 10-bit error check symbols from each reformatted block of 10-bit data symbols;

second reformatting means connected to said encoder and for reformatting said r 10-bit error check symbols generated by said encoder into (10/m)*r m-bit error check symbols;

check symbol appending means connected to the second reformatting means for appending said (10/m)*r m-bit error check symbols to the respective m-bit data block from which they were generated;

a solid state data storage memory array means connected to the data path and to the check symbol appending means for receiving and storing, said plurality of m-bit data blocks including the respective appended (10/m)*r m-bit error check symbols for each block; and retrieval means connected to the solid state data storage memory array means for retrieving said stored m-bit data blocks from said data storage means and reformatting them into respective 10-bit code words, each retrieved 10-bit code word comprising k 10-bit data symbols and r 10-bit error check symbols.

2. The adjunct data block storage and retrieval system of claim 1 wherein the retrieval means includes:

a syndrome generator for generating r 10-bit error syndromes from each retrieved 10-bit code word;

means for detecting the existence of at least one non-zero error syndrome in a given set of generated error syndromes; and hardware-embodied error correction circuitry comprising:

means for receiving said r 10-bit error syndromes from said syndrome generator when at least one non-zero syndrome is detected, a dedicated Galois field arithmetic logic unit having means for executing arithmetic operations on 10-bit symbols by performing extension field operations over a Galois field of $2^5$, and a programmed controller for providing state instructions to said arithmetic logic unit which cause the arithmetic logic unit to carry out a programmed error correction routine for determining the location of, and correction value for, respectively, up to 2 erroneous 10-bit data symbols in a given retrieved 10-bit code word.

3. The adjunct data block storage and retrieval system of claim 2, said dedicated Galois field arithmetic logic unit operating upon a Galois field $GF(2^5)$ generated from an irreducible polynomial $g(x)=x^5+x^2+1$, over $GF(2)$.

4. The adjunct data block storage and retrieval system of claim 3, said dedicated Galois field arithmetic logic unit further operating upon the Galois field $GF(2^{10})$ generated from an irreducible polynomial $P_{1024}(y)=y^2+y+1$, over $GF(2^5)$.

5. The adjunct data block storage and retrieval system of claim 4, said Galois field $GF(2^{10})$ having as its primitive element $(101)h$.

6. The adjunct data block storage and retrieval system of claim 2, said data storage means characterized in that data errors occurring in a block of data stored therein occur in substantially random bit locations.

7. The data storage and retrieval system of claim 2, said encoder combined with said syndrome generator in a single circuit.

8. The adjunct data block storage and retrieval system of claim 1 wherein said solid state data storage memory array comprises a FLASH random access memory.

9. A data storage and retrieval system for receiving, storing and retrieving, respectively, data packetized in blocks of m-bit data symbols, comprising:

an interface circuit for receiving the blocks of m-bit data symbols from an external data processing system;

a block buffer connected to the interface circuit for temporarily storing at least one of the blocks of m-bit data symbols from said interface circuit;

first reformatting means connected to the interface circuit for reformatting said blocks of m-bit data symbols received from said interface circuit into blocks of k 10-bit data symbols;

an encoder circuit connected to the first reformatting means and having means for generating r 10-bit error check symbols from each block of k 10-bit data symbols;

second reformatting means connected to the encoder circuit for reformatting said r 10-bit error check symbols generated by said encoder circuit into (10/m)*r m-bit error check symbols, wherein said (10/m)*r m-bit error check symbols are appended in said block buffer to the respective m-bit data block from which they were generated;

a semiconductor data storage array connected to said interface circuit and to said block buffer for receiving and storing, respectively, said m-bit data blocks, including the respective appended m-bit error check symbols from said block buffer;

data block retrieval means connected to the semiconductor data storage array for retrieving said stored m-bit data blocks from said data storage means and reformatting them into respective 10-bit code words, each retrieved 10-bit code word comprising k 10-bit data symbols and r 10-bit error check symbols;

a syndrome generator for generating r 10-bit error syndromes from each retrieved 10-bit code word;

means for detecting the existence of at least one non-zero error syndrome; and error correction circuitry comprising:

means for receiving said r 10-bit error syndromes from said syndrome generator when at least one non-zero syndrome is detected.

a dedicated Galois field arithmetic logic unit having means for executing arithmetic operations on 10-bit symbols by performing extension field operations over a Galois field of $2^5$, a programmed controller for providing state instructions to said arithmetic logic unit for carrying out a programmed error correction routine for determining the location of, and correction value for, respectively, up to 2 erroneous 10-bit data symbols in a given retrieved 10-bit code word.

10. The data storage and retrieval system of claim 9, said dedicated Galois field arithmetic logic unit operating upon a Galois field $GF(2^5)$ generated from an irreducible polynomial $g(x)=x^5+x^2+1$, over $GF(2)$.

11. The data storage and retrieval system of claim 10, said dedicated Galois field arithmetic logic unit further operating upon a Galois field $GF(2^{10})$ generated from an irreducible polynomial $P_{1024}(y)=y^2+y+1$, over $GF(2^5)$, and having as its primitive element $(101)h$.

12. The data storage and retrieval system of claim 9, further comprising a second buffer for receiving and temporarily storing, respectively, said m-bit data blocks retrieved from said semiconductor data storage array.

13. The data storage and retrieval system of claim 9, wherein r=8.

14. The data storage and retrieval system of claim 9, wherein $(10/m)*k=256$, m=16, and r=8, respectively.

15. The data storage and retrieval system of claim 9, wherein $(10/m)*k=512$, m=8, and r=8, respectively.

16. An adjunct data block storage and retrieval system for connection to a host computer, the system for receiving, storing and retrieving, respectively, digital data packetized in a plurality of blocks of k m-bit data symbols, comprising:

a data path from the host computer connected to an interface, first reformatting means connected to the data path for reformatting the blocks of m-bit data symbols into blocks of 10-bit data symbols;

an encoder connected to the first reformatting means and having means for generating r 10-bit error check symbols from each reformatted block of 10-bit data symbols;

second reformatting means connected to said encoder and for reformatting said r 10-bit error check symbols generated by said encoder into $(10/m)*r$ m-bit error check symbols;

check symbol appending means connected to the second reformatting means for appending said $(10/m)*r$ m-bit error check symbols to the respective m-bit data block from which they were generated;

a mass-storage block memory means connected to the data path and to the check symbol appending means for receiving and storing said plurality of m-bit data blocks including the respective appended $(10/m)*r$ m-bit error check symbols for each block;

retrieval means connected to the mass-storage block memory means for retrieving said stored m-bit data blocks and reformatting them into respective 10-bit code words, each retrieved 10-bit code word comprising k 10-bit data symbols and r 10-bit error check symbols, the retrieval means further including:

a dedicated Galois field arithmetic logic unit having means for executing an error correction algorithm by performing arithmetic operations on at least some of the r 10-bit error check symbols for locating and correcting up to two error bursts within the data block;

a programmed controller for providing state instructions to said arithmetic logic unit which carry out said error correction algorithm; and, a programmed digital microprocessor means for selectively receiving and processing the said at least some of the r 10-bit error check symbols for executing program-based error correction routines whenever error bursts in excess of two are determined by the dedicated Galois field arithmetic logic unit to be present within the data block.

17. The adjunct data block storage and retrieval system set forth in claim 16 wherein said dedicated Galois field arithmetic logic unit generates a Galois field $GF(2^{10})$ using an irreducible polynomial $P_{1024}(y)=y^2+y+1$, over a Galois field $2^5$, said Galois field $2^5$ being generated using the irreducible polynomial $g(x)=x^5+x^2+1$, over $GF(2)$.

18. The adjunct data block storage and retrieval system set forth in claim 17 wherein said dedicated Galois field arithmetic logic unit includes at least one Galois field $2^5$ multiplier within a Galois field $2^{10}$ multiplier functional sub-unit; and, at least one Galois field $2^5$ inverter within a Galois field $2^{10}$ inverter functional sub-unit.

* * * * *